(12) United States Patent
Morii et al.

(10) Patent No.: US 7,025,905 B2
(45) Date of Patent: Apr. 11, 2006

(54) BLACK COMPOSITE PARTICLES FOR SEMICONDUCTOR SEALING MATERIAL, AND SEMICONDUCTOR SEALING MATERIAL USING THE SAME

(75) Inventors: Hiroko Morii, Hiroshima (JP); Yusuke Shimohata, Hiroshima (JP); Kazuyuki Hayashi, Hiroshima (JP)

(73) Assignee: Toda Kogyo Corporation, Hiroshima-ken (JP)

( * ) Notice: Subject to any disclaimer, the term of this patent is extended or adjusted under 35 U.S.C. 154(b) by 266 days.

(21) Appl. No.: 10/355,242

(22) Filed: Jan. 31, 2003

(65) Prior Publication Data

US 2003/0205699 A1 Nov. 6, 2003

(30) Foreign Application Priority Data

Feb. 7, 2002 (JP) ............................. 2002-030331
Feb. 7, 2002 (JP) ............................. 2002-030332
Nov. 25, 2002 (JP) ............................. 2002-341076

(51) Int. Cl.
*H01B 1/04* (2006.01)

(52) U.S. Cl. ...................... 252/504; 252/508; 106/472; 106/475; 428/403

(58) Field of Classification Search ................ 252/504, 252/506, 507, 508; 106/472, 475, 499; 428/403, 428/404, 405, 407; 524/496
See application file for complete search history.

(56) References Cited

U.S. PATENT DOCUMENTS 6,379,855 B1 * 4/2002 Hayashi et al. .......... 430/106.1
6,666,914 B1 * 12/2003 Hayashi et al. ............. 106/499
6,800,684 B1 * 10/2004 Hayashi et al. ............. 524/442
6,838,218 B1 * 1/2005 Hayashi et al. .......... 430/108.3

FOREIGN PATENT DOCUMENTS

EP    1 262 528 A    12/2002
JP    06 210631       11/1994

OTHER PUBLICATIONS

Kirk-Othmer Encyclopedia of Chemical Technology, 1985, p. 888.*

* cited by examiner

*Primary Examiner*—Mark Kopec
(74) *Attorney, Agent, or Firm*—Nixon & Vanderhye P.C.

(57) ABSTRACT

Black composite particles for a semiconductor sealing material of the present invention, comprises:
    an extender pigment as a core particle; and
    a black pigment formed on surface of the extender pigment in an amount of from 1 to 100 parts by weight based on 100 parts by weight of the extender pigment, and a semiconductor sealing material by using the black composite particles. Such black composite particles are not only enhanced in blackness, moisture resistance, fluidity and tinting strength, but also show an excellent dispersibility in binder resins, and the semiconductor sealing material is capable of exhibiting a high volume resistivity as well as excellent blackness, moisture resistance, soldering heat resistance, flowability and flexural strength.

20 Claims, No Drawings

BLACK COMPOSITE PARTICLES FOR SEMICONDUCTOR SEALING MATERIAL, AND SEMICONDUCTOR SEALING MATERIAL USING THE SAME

BACKGROUND OF THE INVENTION

The present invention relates to black composite particles for semiconductor sealing material and a semiconductor sealing material using the same, and more particularly, to black composite particles for semiconductor sealing material, which are not only enhanced in blackness, moisture resistance, fluidity and tinting strength, but also show an excellent dispersibility in binder resins, and a semiconductor sealing material capable of exhibiting a high volume resistivity as well as excellent blackness, moisture resistance, soldering heat resistance, flowability and flexural strength (rigidity) by using the black composite particles.

In order to physically and chemically protect and fix electronic parts such as IC, LSI, transistors, thyristers and diodes, there are conventionally known so-called resin sealing techniques for sealing these electronic parts with thermosetting plastic resins.

With the recent development of large-scale sealed plastic packages, silica particles are added as a filler to semiconductor sealing materials in order to enhance a mechanical strength thereof.

However, it is also known that the silica particles have silanol (Si—OH) groups on the surface thereof and, therefore tend to show a high water absorption property due to hydrogen bonds of the silanol groups.

Since the plastic packages are exposed to an elevated temperature as high as not less than 200° C. during a soldering step when mounted on printed wiring boards, there arise problems such as formation of cracks in the packages and formation of gaps on the surface of Si chips due to vaporization of water absorbed therein under high temperature condition.

On the other hand, it is required that the plastic packages show a black color for rendering the packages light-non-transmittable. For this purpose, carbon black is usually used as a colorant. However, the carbon black tends to be self-agglomerated because of fine particles having an primary average particle diameter as small as about 0.005 to 0.05 μm, so that it may be difficult to disperse the carbon black in the form of fine particles in resin compositions. In addition, it is known that the agglomerated carbon black is in the form of coarse particles having a maximum particle diameter of usually 0.1 μm to 5 mm. When applied to semiconductor sealing materials, the agglomerated carbon black tends to cause clogging between the printed wiring patterns, resulting in defects such as leak. Further, since the carbon black particles are bulky particles having a bulk density of about 0.1 g/cm$^3$ and, therefore, tend to be deteriorated in handling property and workability. Furthermore, since the carbon black particles themselves are a conductive material, it may be difficult to add a large amount of carbon black particles to the semiconductor sealing material requiring a high insulating property.

For these reasons, it has been required to improve various properties of the semiconductor sealing materials, such as a moisture resistance, a blackness, an electrical resistance and a mechanical strength, by developing new silica particles as filler.

In addition, it is demanded to provide semiconductor sealing materials having a good flowability upon molding.

At present, in order to enhance a compatibility with binder resins, there are known techniques for treating the surface of the silica particles with a silane coupling agent or silicone oil (Japanese Patent Application Laid-Open (KOKAI) Nos. 8-245835(1996) and 10-279667(1998), etc.); techniques for previously heating the silica particles in a temperature range of 100 to 1,000° C. and then treating the thus pre-heated silica particles with silane coupling agent in order to reduce the amount of silanol groups on the surface of the silica particles (Japanese Patent Application Laid-Open (KOKAI) No. 11-43320(1999)); and techniques for controlling the maximum particle diameter of carbon black or silica particles added to resin compositions (Japanese Patent Application Laid-Open (KOKAI) Nos. 2001-19833, 2001-69268, 2001-247747 and 2001-329146).

At present, it has been strongly required to provide black particles for semiconductor sealing material, which can exhibit not only excellent moisture resistance, blackness, fluidity and tinting strength, but also excellent dispersibility in binder resins. However, the conventional black particles have failed to satisfy such various properties.

Namely, in Japanese Patent Application Laid-Open (KOKAI) Nos. 8-245835(1996) and 10-279667(1998), there are described the silica particles whose surface is treated with silane coupling agent or silicone oil. However, when the silica particles are used in semiconductor sealing materials, since some of the silanol groups thereof still remain unreacted with the silane coupling agent, the obtained semiconductor sealing materials show a high water absorption property, resulting in problems such as occurrence of cracks upon soldering. Also, since black pigments such as carbon black must be separately added to binder resins, the obtained semiconductor sealing materials tend to be deteriorated in flowability and electrical resistance.

Further, in Japanese Patent Application Laid-Open (KOKAI) No. 11-43320(1999), it is described that the silica particles previously heated in a temperature range of 100 to 1,000° C. and then treated with the silane coupling agent are used as particles for semiconductor sealing materials. Although the thus treated silica particles exhibit a low water absorption property because of a less content of residual silanol groups, it is required to separately add the black pigments such as carbon black to binder resins, so that the obtained semiconductor sealing materials tend to be deteriorated in flowability and electrical resistance.

Also, in Japanese Patent Application Laid-Open (KOKAI) Nos. 2001-19833, 2001-69268, 2001-247747 and 2001-329146, it is described the control of the maximum particle diameter of the carbon black particles and/or silica particles added to resin compositions. However, since the carbon black particles and the silica particles are separately added to the binder resins, the obtained semiconductor sealing materials show a low electrical resistance.

As a result of the present inventors' earnest studies for solving the above problems, it has been found that by adhering black pigments onto the surface of extender pigments in an amount of 1 to 100 parts by weight based on 100 parts by weight of the extender pigments, the obtained black composite particles can exhibit high blackness, moisture resistance, fluidity and tinting strength, but also excellent dispersibility in binder resins, and are useful as a component for semiconductor sealing materials. The present invention has been attained on the basis of the finding.

SUMMARY OF THE INVENTION

An object of the present invention is to provide black composite particles for semiconductor sealing material, which can exhibit not only excellent moisture resistance, blackness, fluidity and tinting strength, but also excellent dispersibility in binder resins, by adhering finely dispersed black pigments onto the surface of extender pigments.

Another object of the present invention is to provide a semiconductor sealing material having a high volume resistivity value as well as more excellent blackness, soldering heat resistance, flowability and flexural strength.

To accomplish the aims, in a first aspect of the present invention, there are provided black composite particles for semiconductor sealing material, comprising:

an extender pigment as a core particle; and a black pigment formed on surface of the extender pigment in an amount of from 1 to 100 parts by weight based on 100 parts by weight of the extender pigment.

In a second aspect of the present invention, there are provided black composite particles for semiconductor sealing material, comprising:

an extender pigment as a core particle;

a gluing agent coating layer formed on surface of the extender pigment; and a black pigment coat formed on the gluing agent coating layer in an amount of 1 to 100 parts by weight based on 100 parts by weight of the extender pigment.

In a third aspect of the present invention, there is provided a semiconductor sealing material comprising:

black composite particles comprising an extender pigment as a core particle and a black pigment formed on surface of the extender pigment in an amount of 1 to 100 parts by weight based on 100 parts by weight of the extender pigment; and a binder resin.

In a fourth aspect of the present invention, there is provided a semiconductor sealing material comprising:

black composite particles comprising an extender pigment as a core particle, a gluing agent coating layer formed on surface of the extender pigment and a black pigment coat formed on the gluing agent coating layer in an amount of 1 to 100 parts by weight based on 100 parts by weight of the extender pigment; and a binder resin.

In a fifth aspect of the present invention, there are provided black composite particles for semiconductor sealing material, comprising:

an extender pigment as a core particle; and a carbon black coat formed on surface of the extender pigment in an amount of 1 to 100 parts by weight based on 100 parts by weight of the extender pigment.

In a sixth aspect of the present invention, there are provided black composite particles for semiconductor sealing material, having an primary average particle diameter of 0.005 to 30.0 μm, and comprising:

an extender pigment as a core particle; and a black pigment coat formed on the gluing agent coating layer in an amount of 1 to 100 parts by weight based on 100 parts by weight of the extender pigment.

In a seventh aspect of the present invention, there are provided black composite particles for semiconductor sealing material, having an primary average particle diameter of 0.005 to 10.0 μm, a volume average particle diameter ($D_{50}$) of 0.05 to 15.0 μm, a volume maximum particle diameter ($D_{99}$) of not more than 20 μm and a standard deviation value of volume particle diameter of not more than 2.00, and comprising:

an extender pigment as a core particle;

a gluing agent coating layer formed on surface of the extender pigment; and a black pigment coat formed on the gluing agent coating layer in an amount of 1 to 100 parts by weight based on 100 parts by weight of the extender pigment.

In an eighth aspect of the present invention, there is provided a semiconductor sealing material, comprising:

black composite particles comprising an extender pigment as a core particle and a carbon black coat formed on surface of the extender pigment in an amount of 1 to 100 parts by weight based on 100 parts by weight of the extender pigment; and a binder resin.

In a ninth aspect of the present invention, there is provided a semiconductor sealing material, comprising:

black composite particles having an primary average particle diameter of 0.005 to 30.0 μm and comprising an extender pigment as a core particle, and a black pigment coat formed on the gluing agent coating layer in an amount of 1 to 100 parts by weight based on 100 parts by weight of the extender pigment; and a binder resin.

In a tenth aspect of the present invention, there is provided a semiconductor sealing material, comprising:

black composite particles having an primary average particle diameter of 0.005 to 10.0 μm, a volume average particle diameter ($D_{50}$) of 0.05 to 15.0 μm, a volume maximum particle diameter ($D_{99}$) of not more than 20 μm and a standard deviation value of volume particle diameter of not more than 2.00, and comprising an extender pigment as a core particle, a gluing agent coating layer formed on surface of the extender pigment and a black pigment coat formed on the gluing agent coating layer in an amount of 1 to 100 parts by weight based on 100 parts by weight of the extender pigment; and a binder resin.

In an eleventh aspect of the present invention, there is provided a liquid semiconductor sealing material, comprising:

black composite particles having an primary average particle diameter of 1.0 to 30.0 μm, and comprising an extender pigment as a core particle, a gluing agent coating layer formed on surface of the extender pigment, and a carbon black coat formed on the gluing agent coating layer in an amount of 1 to 100 parts by weight based on 100 parts by weight of the extender pigment; and a binder resin.

In a twelfth aspect of the present invention, there are provided black composite particles for semiconductor sealing material, having have a primary average particle diameter of 0.005 to 30.0 μm, a BET specific surface area value of 0.1 to 500 m$^2$/g, and a blackness (L* value) of 14.5 to 22.0, comprising:

an extender pigment as a core particle; and a black pigment formed on surface of the extender pigment in an amount of from 1 to 100 parts by weight based on 100 parts by weight of the extender pigment.

In a thirteenth aspect of the present invention, there are provided black composite particles for semiconductor sealing material, having have a primary average particle diameter of 0.005 to 30.0 μm, a BET specific surface area value of 0.1 to 500 m$^2$/g, and a blackness (L* value) of 14.5 to 22.0.

comprising:
an extender pigment as a core particle;
a gluing agent coating layer formed on surface of the extender pigment; and
a black pigment coat formed on the gluing agent coating layer in an amount of 1 to 100 parts by weight based on 100 parts by weight of the extender pigment.

In a fourteenth aspect of the present invention, there are provided black composite particles for semiconductor sealing material, having a primary average particle diameter of 0.005 to 10.0 µm, a volume average particle diameter ($D_{50}$) of 0.05 to 15.0 µm, a volume maximum particle diameter ($D_{99}$) of not more than 20 µm, a standard deviation value of volume particle diameter of not more than 2.00, and a water content of not more than 2.0% by weight, comprising:
an extender pigment as a core particle;
a gluing agent coating layer formed on surface of the extender pigment; and
a black pigment coat formed on the gluing agent coating layer in an amount of 1 to 100 parts by weight based on 100 parts by weight of the extender pigment.

In a fifteenth aspect of the present invention, there is provided a semiconductor sealing material having has a blackness (L* value) of 14.5 to 24.0, a volume resistivity value of not less than $5.0 \times 10^7$ Ω·cm and a flexural strength at room temperature of not less than 150 MPa,
comprising:
black composite particles comprising an extender pigment as a core particle and a black pigment formed on surface of the extender pigment in an amount of 1 to 100 parts by weight based on 100 parts by weight of the extender pigment; and
a binder resin.

DETAILED DESCRIPTION OF THE INVENTION

The present invention is described in detail below.

First, the black composite particles for semiconductor sealing material according to the present invention are described.

The black composite particles for semiconductor sealing material according to the present invention, comprise an extender pigment as a core particle and a black pigment adhered onto the surface of the extender pigment.

In the present invention, as the extender pigments, there may be used silica particles such as silica powder, white carbon, fine silicic acid powder and fine diatomaceous earth particles; clay; calcium carbonate; barium sulfate such as precipitated barium sulfate; alumina white; talc; transparent titanium oxide; satin white; or the like. In the consideration of good mechanical strength of the obtained semiconductor sealing materials, among these extender pigments, preferred are the silica particles.

The extender pigments may be those particles having any suitable shape, such as spherical particles, granular particles, polyhedral particles, acicular particles, spindle-shaped particles, rice ball-shaped particles, flake-shaped particles, scale-shaped particles and plate-shaped particles. In the consideration of good fluidity of the obtained black composite particles for semiconductor sealing material, among these particles, preferred are spherical particles or granular particles having a sphericity (primary average particle diameter/primary average minimum diameter) of from 1.0:1 to less than 2.0:1, and more preferred are those having a sphericity of 1.0:1 to 1.5:1.

The lower limit of the primary average particle diameter of the extender pigments is usually 0.005 µm, preferably 0.010 µm, more preferably 0.015 µm, still more preferably 0.020 µm. The upper limit of the primary average particle diameter of the extender pigments is usually 30.0 µm, preferably 20.0 µm, more preferably 15.0 µm, still more preferably 10.0 µm, further still more preferably 8.0 µm, and most preferably 6.0 µm.

When the primary average particle diameter of the extender pigments is more than 30.0 µm, the obtained black composite particles become coarse, resulting in deteriorated dispersibility in binder resins. When the primary average particle diameter of the extender pigments is less than 0.005 µm, such particles tend to be agglomerated due to fine particles. As a result, it becomes difficult to adhere uniformly the black pigments onto the surface of the extender pigment.

In the case of a solid semiconductor sealing material, the primary average particle diameter of the extender pigments used is usually 0.005 to 30.0 µm, preferably 0.010 to 20.0 µm, more preferably 0.015 to 15.0 µm, still more preferably from 0.020 µm to less than 2.0 µm.

In the case of a liquid semiconductor sealing material, the primary average particle diameter of the extender pigments used is preferably 1.0 to 30.0 µm, preferably 1.5 to 20.0 µm, more preferably from 2.0 µm to less than 15.0 µm.

The lower limit of the BET specific surface area value of the extender pigments is usually not less than 0.1 m²/g, preferably not less than 0.2 m²/g, more preferably not less than 0.3 m²/g. When the BET specific surface area value is less than 0.1 m²/g, the extender pigments become coarse, so that the obtained black composite particles also become coarse, resulting in deteriorated tinting strength and poor dispersibility in binder resins. In the consideration of the uniform adhesion of the black pigments on the surface of the extender pigment, the upper limit of the BET specific surface area value of the extender pigments is usually 500 m²/g, preferably 400 m²/g, more preferably 300 m²/g.

In the case of a solid semiconductor sealing material, the BET specific surface area value of the extender pigments is 0.1 to 500 m²/g, preferably 0.2 to 400 m²/g, more preferably 0.3 to 300 m²/g.

In the case of a liquid semiconductor sealing material, the BET specific surface area value of the extender pigments is preferably 0.1 to 100 m²/g, more preferably 0.2 to 75 m²/g, still more preferably 0.3 to 50 m²/g.

The extender pigments used in the present invention have a water content of usually 2.00 to 3.00% by weight.

As to the fluidity of the extender pigments used in the present invention, the fluidity index thereof is usually not less than 40, preferably 43 to 80, more preferably 46 to 80. When the fluidity index is less than 40, the extender pigments fail to show a good fluidity, so that it may be difficult to obtain black composite particles for semiconductor sealing material which can exhibit an excellent fluidity.

As to the hue of the extender pigments, the C* value thereof is usually not more than 16.0, preferably not more than 14.0, more preferably not more than 12.0. When the C* value is more than 16.0, the hue of the core particles is too strong, so that it may be difficult to obtain black composite particles having a high blackness.

In the consideration of obtaining the black composite particles for semiconductor sealing material, having good fluidity, tinting strength and moisture resistance according to the present invention, it is preferred that the black pigments are adhered through a gluing agent coating layer onto the surface of the extender pigments, that is, the black pigment coat is formed on the surface of the extender pigment through the gluing agent coat layer.

The gluing agent used in the present invention may be of any type as long as the black pigments can be adhered onto the surface of the magnetic particles through the gluing agent. Examples of the gluing agents may include organosilicon compounds such as alkoxysilanes, fluoroalkylsilanes and polysiloxanes; various coupling agents such as silane-based coupling agents, titanate-based coupling agents, aluminate-based coupling agents and zirconate-based coupling agents; oligomer or polymer compounds; and a mixture thereof. In the consideration of high adhesion strength of carbon black onto the surface of the extender pigment as well as good fluidity and tinting strength of the obtained black composite particles, among these gluing agents, preferred are the organosilicon compounds such as alkoxysilanes, fluoroalkylsilanes and polysiloxanes, and various coupling agents such as silane-based coupling agents, titanate-based coupling agents, aluminate-based coupling agents and zirconate-based coupling agents.

Also, in the consideration of the water content of the obtained black composite particles, as the gluing agent, there may be used those having a reactive group capable of bonding or hydrolyzing with hydroxy groups existing on the surface of the extender pigments. Examples of the gluing agents may include organosilicon compounds such as alkoxysilanes, fluoroalkylsilanes and polysiloxanes; methyl hydrogen polysiloxanes; various coupling agents such as silane-based coupling agents, titanate-based coupling agents, aluminate-based coupling agents and zirconate-based coupling agents; oligomer or polymer compounds; and a mixture thereof.

In particular, in the case where fine silica particles are used as the core particles, it is preferable to use the organosilicon compounds or the silane-based coupling agents as the gluing agent.

The organosilane compounds can be produced from alkoxysilane compounds represented by the formula (I):

wherein $R^1$ is $C_6H_5$—, $(CH_3)_2CHCH_2$— or n-$C_bH_{2b+1}$— (wherein b is an integer of 1 to 18); X is $CH_3O$— or $C_2H_5O$—; and a is an integer of 0 to 3.

Specific examples of the alkoxysilanes may include methyltriethoxysilane, dimethyldiethoxysilane, phenyltriethoxysilane, diphenyldiethoxysilane, dimethyldimethoxysilane, methyltrimethoxysilane, phenyltrimethoxysilane, diphenyldimethoxysilane, isobutyltrimethoxysilane, decyltrimethoxysilane or the like.

In the consideration of good fluidity and tinting strength of the obtained black composite particles, preferred are the organosilane compounds obtainable from methyltriethoxysilane, methyltrimethoxysilane, dimethyldimethoxysilane or phenyltriethoxysilane.

As the polysiloxanes, there may be used those compounds represented by the formula (II):

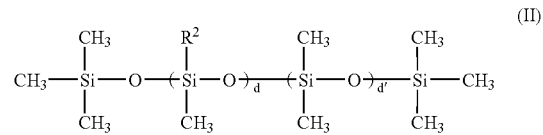

wherein $R^2$ is H— or $CH_3$—, d is an integer of 15 to 370, and d' is an integer of 15 to 370.

As the modified polysiloxanes, there may be used (a) polysiloxanes modified with polyethers represented by the formula (III):

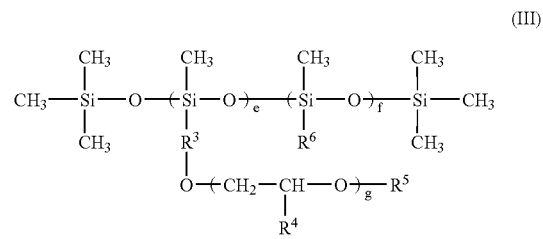

wherein $R^3$ is —$(-CH_2-)_h$—; $R^4$ is —$(-CH_2-)_i$—$CH_3$; $R^5$ is —OH, —COOH, —CH=$CH_2$, —C($CH_3$)=$CH_2$ or —$(-CH_2-)_j$—$CH_3$; $R^6$ is —$(-CH_2-)_k$—$CH_3$; g and h are an integer of 1 to 15; i, j and k are an integer of 0 to 15; e is an integer of 1 to 50; and f is an integer of 1 to 300;

(b) polysiloxanes modified with polyesters represented by the formula (IV):

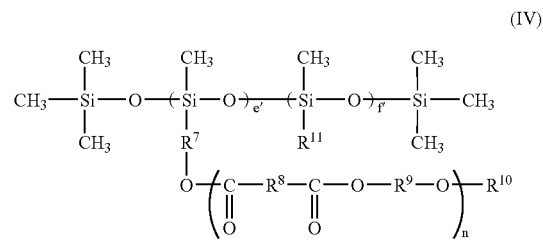

wherein $R^7$, $R^8$ and $R^9$ are —$(-CH_2-)_q$— and may be the same or different; $R^{10}$ is —OH, —COOH, —CH=$CH_2$, —CH($CH_3$)=$CH_2$ or —$(-CH_2-)_r$—$CH_3$; $R^{11}$ is —$(-CH_2-)_s$—$CH_3$; n and q are an integer of 1 to 15; r and s are an integer of 0 to 15; e' is an integer of 1 to 50; and f' is an integer of 1 to 300; and (c) polysiloxanes modified with epoxy compounds represented by the formula (V):

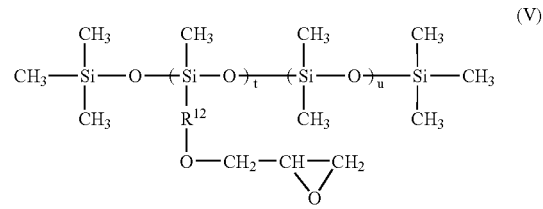

wherein $R^{12}$ is $-(-CH_2-)_v-$; v is an integer of 1 to 15; t is an integer of 1 to 50; and u is an integer of 1 to 300; or a mixture thereof.

As the terminal-modified polysiloxanes, there may be used those represented by the formula (IV):

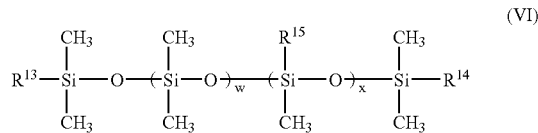

(VI)

wherein $R^{13}$ and $R^{14}$ are —OH, $R^{16}$OH or $R^{17}$ COOH and may be the same or different; $R^{15}$ is —$CH_3$ or —$C_6H_5$; $R^{16}$ and $R^{17}$ are $-(-CH_2-)_y-$; y is an integer of 1 to 15; w is an integer of 1 to 200; and x is an integer of 0 to 100.

In the consideration of good fluidity and tinting strength of the obtained black composite particles, polysiloxanes having methyl hydrogen siloxane units, polyether-modified polysiloxanes and carboxylic acid-terminal-modified polysiloxanes are also preferred.

The fluoroalkyl organosilane compounds may be produced from fluoroalkylsilane compounds represented by the formula (VII):

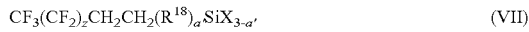

(VII)

wherein $R^{18}$ is $CH_3-$, $C_2H_5-$, $CH_3O-$ or $C_2H_5O-$; X is $CH_3O-$ or $C_2H_5O-$; and z is an integer of 0 to 15; and a' is an integer of 0 to 2.

Specific examples of the fluoroalkylsilanes may include trifluoropropyl trimethoxysilane, tridecafluorooctyl trimethoxysilane, heptadecafluorodecyl trimethoxysilane, heptadecafluorodecyl methyldimethoxysilane, trifluoropropyl triethoxysilane, tridecafluorooctyl triethoxysilane, heptadecafluorodecyl triethoxysilane or the like.

In the consideration of good fluidity and tinting strength of the obtained black composite particles, preferred are trifluoropropyl trimethoxysilane, tridecafluorooctyl trimethoxysilane or heptadecafluorodecyl trimethoxysilane, and most preferred are trifluoropropyl trimethoxysilane or tridecafluorooctyl trimethoxysilane.

Examples of the silane-based coupling agents may include vinyltrimethoxysilane, vinyltriethoxysilane, γ-aminopropyltriethoxysilane, γ-glycidoxypropyltrimethoxysilane, γ-mercaptopropyltrimethoxysilane, γ-methacryloxypropyltrimethoxysilane, N-β(aminoethyl)-γ-aminopropyltrimethoxysilane, γ-glycidoxypropylmethyldimethoxysilane, γ-chloropropyltrimethoxysilane or the like.

Examples of the titanate-based coupling agents may include isopropyltristearoyl titanate, isopropyltris(dioctylpyrophosphate)titanate, isopropyltri(N-aminoethyl-aminoethyl)titanate, tetraoctylbis(ditridecylphosphate)titanate, tetra(2,2-diaryloxydimethyl-1-butyl)bis(ditridecyl)phosphate titanate, bis(dioctylpyrophosphate)oxyacetate titanate, bis(dioctylpyrophosphate)ethylene titanate or the like.

Examples of the aluminate-based coupling agents may include acetoalkoxyaluminum diisopropilate, aluminumdiisopropoxymonoethylacetoacetate, aluminumtrisethylacetoacetate, aluminumtrisacetylacetonate or the like.

Examples of the zirconate-based coupling agents may include zirconiumtetrakisacetylacetonate, zirconiumdibutoxybisacetylacetonate, zirconiumtetrakisethylacetoacetate, zirconiumtributoxymonoethylacetoacetate, zirconiumtributoxyacetylacetonate or the like.

It is preferred to use oligomer compounds having a molecular weight of from 300 to less than 10,000. It is preferred to use polymer compounds having a molecular weight of 10,000 to about 100,000. In the consideration of forming a uniform coating layer on the surface of the extender pigments, the oligomers or polymer compounds are preferably in a liquid state, or are soluble in various solvents.

The amount of the gluing agent coating layer formed on the surface of the extender pigments is usually 0.01 to 15.0% by weight, preferably 0.02 to 12.5% by weight, more preferably 0.03 to 10.0% by weight (calculated as C) based on the weight of the gluing agent-coated extender pigments. When the amount of the gluing agent coating layer is less than 0.01% by weight, it may be difficult to adhere not less than 0.1 part by weight of the black pigments onto 100 parts by weight of the extender pigments.

In the consideration of the water content of the obtained black composite particles, the gluing agent is preferably coated in such an amount that the water content of the gluing agent-coated extender pigments (hereinafter referred to merely as "intermediate particles") is reduced to not more than 2% by weight.

Also, although the coating of the gluing agent in an amount of 15.0% by weight usually enables 0.1 to 100 parts by weight of the black pigments to be adhered onto 100 parts by weight of the extender pigments, such a gluing agent having a reactive group capable of bonding or hydrolyzing with hydroxy groups existing on the surface of the extender pigments may be coated in an amount of more than 15% by weight in order to further reduce the water content of the intermediate particles to not more than 2% by weight.

As the black pigments adhered, there may be used fine carbon black particles such as furnace black, channel black and acetylene black; and organic black pigments such as aniline black and perylene black. In the consideration of good tinting strength of the obtained black composite particles, among these black pigments, preferred are fine carbon black particles.

Also, in the consideration of good moisture resistance of the obtained black composite particles, the black pigments used are preferably hydrophobic. More preferably, the water content (moisture resistance) of the black pigments is preferably not more than 2.50% by weight, more preferably not more than 2.00% by weight when measured under the below-mentioned conditions.

The amount of the black pigments adhered, or the black pigment coat is usually 0.1 to 100 parts by weight, preferably 0.2 to 90 parts by weight, more preferably 0.3 to 80 parts by weight based on 100 parts by weight of the extender pigments. When the amount of the black pigment is less than 0.1 parts by weight, the amount of the black pigments adhered or coated on the surface of the extender pigments is too small, so that it may be difficult to obtain the black composite particles aimed by the present invention. When the amount of the black pigment is more than 100 parts by weight, such a large amount of the black pigment may make it difficult to control the amount of the black composite particles added to binder resins in order to produce semiconductor sealing materials having required properties.

The shape of the black composite particles for semiconductor sealing material according to the present invention largely depend upon those of the extender pigments as core particles. The black composite particles have a particle configuration similar to that of the core particles.

More specifically, the lower limit of the primary average particle diameter of the black composite particles for semiconductor sealing material according to the present invention is usually 0.005 μm, preferably 0.01 μm, more preferably 0.015 μm, still more preferably 0.020 μm. The upper limit of the primary average particle diameter of the black composite particles for semiconductor sealing material according to the present invention is usually 30.0 μm, preferably 20.0 μm, more preferably 15.0 μm, still more preferably 10.0 μm, further still more preferably 8.0 μm, and most preferably 6.0 μm.

When the primary average particle diameter of the black composite particles is more than 30.0 μm, the particle size of the black composite particles becomes too large, resulting in deteriorated tinting strength. When the primary average particle diameter of the black composite particles is less than 0.005 μm, the black composite particles tend to be agglomerated together due to fine particles, so that it may be difficult to disperse the black composite particles in binder resins.

In the case of a solid semiconductor sealing material, the primary average particle diameter of the black composite particles for semiconductor sealing material used is usually 0.005 to 30.0 μm, preferably 0.010 to 20.0 μm, more preferably 0.015 to 15.0 μm, still more preferably from 0.020 μm to less than 2.0 μm.

In the case of a liquid semiconductor sealing material, the primary average particle diameter of the black composite particles for semiconductor sealing material used is preferably 1.0 to 30.0 μm, preferably 1.5 to 20.0 μm, more preferably from 2.0 μm to less than 15.0 μm.

The black composite particles for semiconductor sealing material according to the present invention may be those particles having any suitable shape, such as spherical particles, granular particles, polyhedral particles, acicular particles, spindle-shaped particles, rice ball-shaped particles, flake-shaped particles, scale-shaped particles and plate-shaped particles. In the consideration of good fluidity of the black composite particles, among these particles, preferred are spherical particles or granular particles having a sphericity (primary average particle diameter/primary average minimum diameter) of from 1.0:1 to less than 2.0:1, and more preferred are those having a sphericity of 1.0:1 to 1.5:1.

In order to prevent the occurrence of leak (short circuit) by the agglomerates of the black composite particles entered into the space between the wiring patterns upon molding of the resin composition, it is preferred to subjecting the black composite particles to pulverization and classification treatments. The black composite particles treated have a volume average particle diameter ($D_{50}$) of preferably 0.05 to 15.0 μm, more preferably 0.10 to 12.0 μm, still more preferably 0.15 to 9.0 μm, further still more preferably 0.2 to 6.0 μm.

Also, the black composite particles treated have a volume maximum particle diameter ($D_{99}$) of preferably not more than 20 μm, more preferably not more than 15 μm, still more preferably not more than 10 μm.

Such the black composite particles treated have a standard deviation value of volume particle diameter of preferably not more than 2.00, more preferably not more than 1.80, still more preferably not more than 1.60, further still more preferably not more than 1.40, most preferably not more than 1.20. In the consideration of the industrial productivity, the lower limit of the standard deviation value of volume particle diameter of the black composite particles for semiconductor sealing material is preferably 1.01.

The lower limit of the BET specific surface area value of the black composite particles according to the present invention is usually 0.1 m$^2$/g, preferably 0.2 m$^2$/g, more preferably 0.3 m$^2$/g. The upper limit of the BET specific surface area value of the black composite particles according to the present invention is usually 500 m$^2$/g, preferably 400 m$^2$/g, more preferably 300 m$^2$/g.

When the BET specific surface area value of the black composite particles is less than 0.1 m$^2$/g, the obtained black composite particles become coarse, resulting in deteriorated tinting strength. When the BET specific surface area value of the black composite particles is more than 500 m$^2$/g, the obtained particles tend to be agglomerated together due to fine particles, resulting in deteriorated dispersibility in binder resins.

In the case of a solid semiconductor sealing material, the BET specific surface area value of the black composite particles is 0.1 to 500 m$^2$/g, preferably 0.2 to 400 m$^2$/g, more preferably 0.3 to 300 m$^2$/g.

In the case of a liquid semiconductor sealing material, the BET specific surface area value of the black composite particles is preferably 0.1 to 100 m$^2$/g, more preferably 0.2 to 75 m$^2$/g, still more preferably 0.3 to 50 m$^2$/g.

As to the fluidity of the black composite particles of the present invention, the fluidity index thereof is usually not less than 50, preferably not less than 55, more preferably 60 to 90, still more preferably 65 to 90, most preferably 70 to 90.

In particular, in the case of the black composite particles comprising the extender pigments, a gluing agent coating layer formed on the surface of the extender pigments and a black pigment coat formed on the gluing agent coating layer, the fluidity index thereof is preferably not less than 55, more preferably not less than 60, still more preferably 65 to 90.

Also, as to the fluidity of the black composite particles having a standard deviation value of volume particle diameter of not more than 2.00 by subjecting the particles to pulverization and classification treatments, the fluidity index thereof is preferably not less than 60, more preferably not less than 65, still more preferably 70 to 90.

When the fluidity index is less than 50, the black composite particles tend to be deteriorated in fluidity, so that it may be difficult to further improve the fluidity and mechanical strength of the obtained semiconductor sealing material.

Further, in the case where the gluing agent having a reactive group capable of bonding or hydrolyzing with hydroxy groups existing on the surface of the extender pigments is used to reduce the water content of the black composite particles, the black composite particles have a water content of preferably not more than 2.0% by weight, more preferably not more than 1.5% by weight, still more preferably not more than 1.0% by weight.

The black composite particles of the present invention have a moisture resistance of usually not more than 0.30%, preferably not more than 0.28%, more preferably not more than 0.26%, still more preferably not more than 0.24% when measured by the below-mentioned method. In particular, in the case of the black composite particles comprising the extender pigments, a gluing agent coating layer formed on the surface of the extender pigments and a black pigment coat formed on the gluing agent coating layer, the moisture resistance thereof is preferably not more than 0.28%, more preferably not more than 0.26%, still more preferably not more than 0.24% when measured by the below-mentioned method.

Further, in the case where the black pigments having a water content of 2.5% by weight are used to improve the moisture resistance of the black composite particles, the moisture resistance of the obtained black composite particles is preferably not more than 0.24%, more preferably not more than 0.22%, still more preferably 0.20% when measured by the below-mentioned method.

When the moisture resistance of the black composite particles is more than 0.30%, the obtained semiconductor sealing material tends to suffer from cracks since the water content thereof is increased due to water absorbed in the particles during the storage.

As to the blackness of the black composite particles, the $L*$ value thereof is preferably not more than 22.0, more preferably not more than 21.0, still more preferably not more than 20.0. When the $L*$ value is more than 22.0, the obtained black composite particles exhibit a too high lightness and, therefore, may fail to show an excellent blackness. The lower limit of the $L*$ value is preferably 14.5.

The black composite particles of the present invention have a tinting strength of preferably not less than 110%, more preferably not less than 115% when measured by the below-mentioned method. In particular, in the case of the black composite particles comprising the extender pigments, a gluing agent coating layer formed on the surface of the extender pigments and a black pigment coat formed on the gluing agent coating layer, the tinting strength thereof is preferably not less than 115%, more preferably not less than 120%, still more preferably not less than 125% when measured by the below-mentioned method.

The desorption degree of the black pigments form the black composite particles of the present invention is preferably the rank 5, 4 or 3, more preferably the rank 5 or 4 when visually observed by the below-mentioned method. In particular, in the case of the black composite particles comprising the extender pigments, a gluing agent coating layer formed on the surface of the extender pigments and a black pigment coat formed on the gluing agent coating layer, the desorption degree of the black pigments therefrom is preferably the rank 5 or 4, more preferably the rank 5. When the desorption degree of the black pigments is the rank 1 or 2, it may be difficult to attain the aims of the present invention.

Alternatively, the desorption percentage of the black pigments from the black composite particles comprising the extender pigments, a gluing agent coating layer formed on the surface of the extender pigments and a black pigment coat formed on the gluing agent coating layer, is preferably not more than 20%, more preferably not more than 10%. When the desorption percentage of the black pigments from the black composite particles is more than 20%, the desorbed black pigments tend to be agglomerated together, thereby forming coarse particles. As a result, uniform dispersion of the black composite particles in binder resins tends to be inhibited by the coarse particles. In addition, the core particles from which the black pigments are desorbed tend to show a water absorption property, resulting in increased water content thereof. Further, the obtained particles tend to be deteriorated in blackness, tinting strength and fluidity, so that it may be difficult to attain the aims of the present invention.

In the black composite particles for semiconductor sealing material according to the present invention, the surface of the extender pigments may be previously coated, if required, with at least one undercoating material selected from the group consisting of hydroxides of aluminum, oxides of aluminum, hydroxides of silicon and oxides of silicon. By coating the surface of the extender pigments with the undercoating material, the obtained black composite particles can show a more excellent fluidity as compared to those using the extender pigments uncoated with the undercoating material.

The amount of the undercoating material coated on the extender pigments is preferably 0.01 to 20% by weight (calculated as Al, $SiO_2$ or a sum of Al and $SiO_2$) based on the weight of the extender pigments coated with the undercoating material.

When the amount of the undercoating material coated is less than 0.01% by weight, it may be difficult to attain the effect of improving the fluidity. When the undercoating material is coated in an amount of 0.01 to 20% by weight, a sufficient effect of improving the fluidity can be attained and, therefore, the coating of the undercoating material in an amount of more than 20% by weight is unnecessary and meaningless.

The black composite particles produced by using the extender pigments coated with the undercoating material have the substantially same particle size, BET specific surface area value, blackness, tinting strength and desorption degree of black pigments as those of the black composite particles produced by using the extender pigments uncoated with the undercoating material according to the present invention. However, the fluidity of the black composite particles can be further improved by using the extender pigments coated with the undercoating material such that the fluidity index thereof increases to preferably not less than 55, more preferably not less than 60, still more preferably 65 to 90, further still more preferably 70 to 90, most preferably 75 to 90.

Next, the semiconductor sealing material of the present invention is described.

The semiconductor sealing material using the black composite particles according to the present invention may be in the form of either a solid semiconductor sealing material or a liquid semiconductor sealing material by varying kinds of binder resins or additives as constituents.

The solid semiconductor sealing material of the present invention comprises the above black composite particles for semiconductor sealing material, a binder resin and a curing agent, and may further contain, if required, other additives such as curing accelerators, inorganic fillers, organic flame retardants, inorganic flame retardants, pigments, surface-treating agents and mold release agents.

As the binder resin for the solid semiconductor sealing material, there may be used those resins ordinarily used in conventional solid semiconductor sealing materials. The binder resin may be selected from resins having two or more epoxy groups in one molecule. Specific examples of the binder resin for the solid semiconductor sealing material may include biphenyl-type epoxy resins, bisphenol-type epoxy resins, phenol novolak-type epoxy resins, cresol novolak-type epoxy resins, triphenol methane-type epoxy resins, alkyl-modified triphenol methane epoxy resins, alicyclic epoxy resins, heterocyclic epoxy resins, triazine nucleus-containing epoxy resins, halides of these epoxy resins or the like. In the consideration of good flowability and mechanical strength of the obtained semiconductor sealing material, among these binder resins, preferred are biphenyl-type epoxy resins.

As the curing agent, there may be used phenol resin-based curing agents such as phenol novolak resins, cresol novolak resins, dicyclopentadiene-modified phenol resins, p-xylylene-modified phenol resins and terpene-modified phenol resins; acid anhydride curing agents such as phthalic anhydride, maleic anhydride and tetrahydrophthalic anhydride; or the like. In the consideration of good moisture resistance of the obtained semiconductor sealing material, among these curing agents, preferred are phenol novolak resins.

The solid semiconductor sealing material of the present invention contains the black composite particles according to the present invention in an amount of usually 0.4 to 95% by weight, preferably 0.45 to 90% by weight, more preferably 0.5 to 85% by weight, in the binder resin.

In the solid semiconductor sealing material of the present invention, the dispersibility of the black composite particles in the binder resin is preferably the rank 5 or 4, more preferably the rank 5 when evaluated by the below-mentioned method.

As to the blackness of the solid semiconductor sealing material, the L* value thereof is preferably not more than 24.0, more preferably not more than 23.0, still more preferably not more than 22.0. When the L* value is more than 24.0, the obtained solid semiconductor sealing material exhibits a too high lightness and, therefore, may fail to show a sufficient blackness. The lower limit of the L* value is preferably about 14.5.

The solid semiconductor sealing material of the present invention has a moisture resistance of usually not more than 0.20%, preferably not more than 0.18%, more preferably not more than 0.16% when measured by the below-mentioned method. In particular, in the case of using the black composite particles comprising the extender pigments, a gluing agent coating layer formed on the surface of the extender pigments and a black pigment coat formed on the gluing agent coating layer, the moisture resistance of the solid semiconductor sealing material is preferably not more than 0.18%, more preferably not more than 0.16%, still more preferably not more than 0.14% when measured by the below-mentioned method. When the moisture resistance of the solid semiconductor sealing material is more than 0.20%, the obtained semiconductor sealing material tends to suffer from cracks.

When the black composite particles having a water content of not more than 2.0% by weight and a moisture resistance of not more than 0.24% when measured by the below-mentioned method are used, the soldering heat resistance of the solid semiconductor sealing material is preferably the rank 5, 4 or 3, more preferably the rank 5 or 4 when evaluated by the below-mentioned method.

As to the flowability of the solid semiconductor sealing material according to the present invention, the spiral flow value thereof is preferably not less than 85 cm, more preferably not less than 90 cm, still more preferably not less than 95 cm when measured under the below-mentioned conditions. In particular, as to the flowability of the solid semiconductor sealing material produced by using the black composite particles comprising the extender pigments, a gluing agent coating layer formed on the surface of the extender pigments and a black pigment coat formed on the gluing agent coating layer, the spiral flow value thereof is preferably not less than 90 cm, more preferably not less than 95 cm, still more preferably not less than 100 cm, most preferably not less than 105 cm.

The solid semiconductor sealing material of the present invention has a volume resistivity value of preferably not less than $5.0 \times 10^7$ $\Omega \cdot cm$, more preferably not less than $1.0 \times 10^8$ $\Omega \cdot cm$, still more preferably not less than $5.0 \times 10^8$ $\Omega \cdot cm$. When the volume resistivity value is less than $5.0 \times 10^7$ $\Omega \cdot cm$, the conductivity of the material becomes too high, so that it may be difficult to use the material as a semiconductor sealing material. The upper limit of the solid semiconductor sealing material is preferably $1.0 \times 10^{17}$ $\Omega \cdot cm$.

The flexural strength at room temperature of the solid semiconductor sealing material is preferably not less than 150 MPa, more preferably not less than 155 MPa, still more preferably not less than 160 MPa, most preferably not less than 165 MPa. When the flexural strength is less than 150 MPa, the obtained solid semiconductor sealing material may fail to show a sufficient mechanical strength.

The liquid semiconductor sealing material according to the present invention comprises the above black composite particles of the present invention, a binder resin and a curing agent, and may further contain, if required, other additives such as curing accelerators, inorganic fillers, organic flame retardants, inorganic flame retardants, pigments, surface-treating agents, leveling agents, defoaming agents, stress-relief agents and solvents.

As the binder resin for the liquid semiconductor sealing material, there may be used those resins ordinarily used in conventional liquid semiconductor sealing materials. The binder resin may be selected from liquid epoxy resins having two or more epoxy groups in one molecule. Specific examples of the binder resin for the liquid semiconductor sealing material may include bisphenol A-type epoxy resins, novolak-type epoxy resins, halogenated epoxy resins, glycidyl ether-type epoxy resins, glycidyl ester-type epoxy resins, glycidyl amine-type epoxy resins, alicyclic epoxy resins, high-molecular-type epoxy resins or the like. In order to improve a mechanical strength, etc. of the obtained liquid semiconductor sealing material, solid epoxy resins such as biphenyl-type epoxy resins or the like may be mixed therein, if required.

As the curing agent for the liquid semiconductor sealing material, there may be used phenol resin-based curing agents such as phenol novolak resins, cresol novolak resins, dicyclopentadiene-modified phenol resins, p-xylylene-modified phenol resins and terpene-modified phenol resins; acid anhydride curing agents such as phthalic anhydride, maleic anhydride and tetrahydrophthalic anhydride; amine-based curing agents such as aliphatic polyamines, polyamide resins and aromatic diamines; Lewis acid complex compounds; or the like.

The liquid semiconductor sealing material of the present invention contains the black composite particles of the present invention in an amount of usually 0.4 to 80% by weight, preferably 0.45 to 75% by weight, more preferably 0.5 to 70% by weight.

The liquid semiconductor sealing material of the present invention has a viscosity of preferably 250 to 750 Pa·s, more preferably 300 to 700 Pa·s, still more preferably 350 to 650 Pa·s.

In the liquid semiconductor sealing material of the present invention, the dispersibility of the black composite particles in the binder resin is preferably the rank 5 or 4, more preferably the rank 5 when measured by the below-mentioned method.

As to the blackness of the liquid semiconductor sealing material of the present invention, the L* value thereof is preferably not more than 24.0, more preferably not more than 23.0, still more preferably not more than 22.0. When the L* value is more than 24.0, the obtained liquid semiconductor sealing material exhibits a too high lightness and, therefore, may fail to show a sufficient blackness. The lower limit of the L* value is preferably about 14.5.

The liquid semiconductor sealing material of the present invention has a volume resistivity value of preferably not less than $5.0 \times 10^7$ $\Omega \cdot cm$, more preferably not less than $1.0 \times 10^8$ $\Omega \cdot cm$, still more preferably not less than $5.0 \times 10^8$ $\Omega \cdot cm$. When the volume resistivity value is less than $5.0 \times$ $10^7$ Ω·cm, the conductivity of the material becomes too high, so that it may be difficult to use the material as a semiconductor sealing material. The upper limit of the liquid semiconductor sealing material is preferably $1.0 \times 10^{17}$ Ω·cm.

The flexural strength of the liquid semiconductor sealing material according to the present invention is preferably not less than 80 MPa, more preferably not less than 90 MPa, still more preferably not less than 100 MPa. When the flexural strength of the liquid semiconductor sealing material is less than 80 MPa, the obtained material may fail to show a sufficient mechanical strength.

Next, the process for producing the black composite particles for semiconductor sealing material according to the present invention is described.

The black composite particles for semiconductor sealing material according to the present invention can be produced by adhering the black pigments onto the surface of the extender pigments.

The method for adhering the black pigments onto the surface of the extender pigments is not particularly restricted as long as the obtained particles can exhibit properties aimed by the present invention. For example, the black composite particles of the present invention can be obtained by adhesion treatment by heat decomposition of $CO_2$, etc., wet treatment, mechanochemical treatment or the like.

Also, the black composite particles comprising the extender pigments, a gluing agent coating layer formed on the surface of the extender pigments and a black pigment coat formed on the gluing agent coating layer according to the present invention, can be produced by mixing the extender pigments with the gluing agent to form a gluing agent coating layer onto the surface of the extender pigments, and then mixing the gluing agent-coated extender pigments with the black pigments to form a black pigment coat onto the gluing agent coating layer.

The coating of the surface of the extender pigments with the gluing agent may be conducted by mechanically mixing and stirring the extender pigments with the gluing agent, or mechanically stirring the extender pigments while spraying the gluing agent thereover. In this case, a substantially whole amount of the gluing agent added can contribute to formation of the gluing agent coating layer on the surface of the extender pigments.

Meanwhile, in the case where alkoxysilanes or fluoroalkylsilanes are used as the gluing agent, a part of the alkoxysilanes or fluoroalkylsilanes may be coated in the form of organosilane compounds obtainable from the alkoxysilanes or fluorine-containing organosilane compounds obtainable from the fluoroalkylsilanes through the coating step. Even in such a case, the subsequent adhesion of the black pigments onto the gluing agent coating layer is not adversely affected.

In order to uniformly coat the surface of the extender pigments with the gluing agent, it is preferred that the agglomerated extender pigments are previously deaggregated using a crusher.

The mixing and stirring of the extender pigments with the gluing agent, and the mixing and stirring of the black pigments with the gluing agent-coated extender pigments, are preferably carried out using an apparatus capable of applying a shear force to the mixed powder layer, especially such an apparatus capable of simultaneously effecting shear action, spatula stroking and compression. Examples of such apparatuses may include wheel-type kneaders, ball-type kneaders, blade-type kneaders, roll-type kneaders or the like. Among these apparatuses, the wheel-type kneaders are preferred to effectively perform the process of the present invention.

Specific examples of the wheel-type kneaders may include edge runners (similar in meaning to mix muller, Simpson mill and sand mill), multimill, Stotz mill, Wet pan mill, corner mill, ring muller or the like. Among these kneaders, preferred are edge runners, multimill, Stotz mill, Wet pan mill and ring muller, and more preferred are edge runners. Specific examples of the ball-type kneaders may include vibration mill or the like. Specific examples of the blade-type kneaders may include Henschel mixer, planetary mixer, Nauter mixer or the like. Specific examples of the roll-type kneaders may include extruders or the like.

The conditions for mixing and stirring the extender pigments with the gluing agent may be appropriately selected so as to coat the surface of the extender pigments with the gluing agent as uniformly as possible. Specifically, the mixing and stirring conditions may be appropriately controlled such that the linear load is preferably 19.6 to 1,960 N/cm (2 to 200 Kg/cm), more preferably 98 to 1,470 N/cm (10 to 150 Kg/cm), most preferably 147 to 980 N/cm (15 to 100 Kg/cm); the treating time is preferably 5 minutes to 24 hours, more preferably 10 minutes to 20 hours; and the stirring speed is preferably 2 to 2,000 rpm, more preferably 5 to 1,000 rpm, most preferably 10 to 800 rpm.

The amount of the gluing agent added is preferably 0.15 to 45 parts by weight based on 100 parts by weight of the extender pigments. When the amount of the gluing agent added is less than 0.15 part by weight, it may be difficult to form the black pigment coat in an amount of not less than 0.1 part by weight based on 100 parts by weight of the extender pigments. That is, by adding the gluing agent in an amount of 0.15 to 45 parts by weight, it is possible to form the black pigment coat in an amount of 0.1 to 100 parts by weight based on 100 parts by weight of the extender pigments. Also, in order to reduce the water content of the black composite particles to not more than 2% by weight, it is preferred that the gluing agent is coated on the surface of the extender pigments in such an amount that the water content of the obtained intermediate particles is reduced to not more than 2% by weight. In this case, the gluing agent may be added in an amount of more than 45 parts by weight based on 100 parts by weight of the extender pigments.

After forming the gluing agent coating layer on the surface of the extender pigments, the black pigments are added, and then mixed and stirred with the gluing agent-coated extender pigments to adhere the black pigments onto the gluing agent coating layer, thereby forming a black pigment coat. Further, the thus obtained black composite particles may be dried or heat-treated, if required.

The black pigments may be added slowly and little by little, especially for a period of usually about 5 minutes to 24 hours, preferably about 5 minutes to 20 hours. Alternatively, the black pigments may be successively added in divided parts until the total amount of the black pigments added reaches 5 to 25 parts by weight based on 100 parts by weight of the extender pigments.

The mixing and stirring conditions may be appropriately selected so as to form a uniform black pigment coat on the gluing agent coating layer, and may be controlled such that the linear load is preferably 19.6 to 1,960 N/cm (2 to 200 Kg/cm), more preferably 98 to 1,470 N/cm (10 to 150 Kg/cm), most preferably 147 to 980 N/cm (15 to 100 Kg/cm); the treating time is preferably 5 minutes to 24 hours, more preferably 10 minutes to 20 hours; and the stirring speed is preferably 2 to 2,000 rpm, more preferably 5 to 1,000 rpm, most preferably 10 to 800 rpm.

The amount of the black pigments added is usually 0.1 to 100 parts by weight, preferably 0.2 to 90 parts by weight, more preferably 0.3 to 80 parts by weight based on 100 parts by weight of the extender pigments. When the amount of the black pigments added is out of the above-specified range, it may be difficult to obtain the black composite particles aimed by the present invention.

Meanwhile, the black composite particles having a volume-average particle diameter ($D_{50}$) of 0.05 to 15.0 μm, a volume maximum particle diameter ($D_{99}$) of not more than 20 μm and a standard deviation value of volume particle diameter of not more than 2.00, can be produced by mixing the extender pigments with the gluing agent to form a gluing agent coating layer on the surface of the extender pigments, mixing the gluing agent-coated extender pigments with the black pigments to form a black pigment coat on the gluing agent coating layer, and then subjecting the thus obtained particles to pulverization and classification.

As the apparatus for pulverizing the thus obtained black composite particles, there may be preferably used fine pulverizers or ultrafine pulverizers. Examples of the pulverizers may include roller mills, impact pulverizers, ball mills, stirring mills, jet pulverizers or the like. Among these pulverizers, jet pulverizers and impact pulverizers can be used more effectively.

Examples of the jet pulverizers may include turning flow-type jet mills, fluidized bed-type jet mills or the like. Among these jet pulverizers, preferred are the fluidized bed-type jet mills. Examples of the impact pulverizers may include hammer mills, pin mills, screen mills, turbo-type mills, centrifugal classification-type mills or the like. Among these impact pulverizers, preferred are the pin mills. Examples of the roller mills may include ring roller mills, centrifugal roller mills or the like. Examples of the ball mills may include rolling ball mills, vibration ball mills, planetary mills or the like. Examples of the stirring mills may include agitation tank-type mills, flowing tube-type mills, annular mills or the like.

As the apparatus for classifying the pulverized black composite particles, there may be suitably used dry-type classifiers such as gravity classifiers, inertia classifiers and centrifugal classifiers. Among these classifiers, the centrifugal classifiers can be used more effectively.

Specific examples of the centrifugal classifiers may include cyclone, classiclone, Startevant-type classifier, micron separator, turboplex, turbo classifier, super separator, dispersion separator or the like. Among these centrifugal classifiers, preferred are turboplex and micron separator. Examples of the gravity classifiers may include horizontal flow-type classifiers, vertical flow-type classifiers, slant flow-type classifiers or the like. Examples of the inertia classifiers may include linear-type classifiers, curve-type classifiers, slant-type classifiers or the like.

The conditions for the pulverization and classification may be appropriately selected so as to obtain the particles having the volume average particle diameter and volume maximum particle diameter as aimed by the present invention.

The heating temperature used in the drying or heating treatment is usually 40 to 150° C., preferably 60 to 120° C., and the heating time is usually 10 minutes to 12 hours, preferably 30 minutes to 3 hours.

Meanwhile, in the case where alkoxysilanes or fluoroalkylsilanes are used as the gluing agent, the alkoxysilanes or fluoroalkylsilanes are finally coated in the form of organosilane compounds obtainable from the alkoxysilanes or fluorine-containing organosilane compounds obtainable from the fluoroalkylsilanes through these steps.

In the case of the black composite particles comprising the extender pigments, a gluing agent coating layer formed on the surface of the extender pigments and a black pigment coat formed on the gluing agent coating layer, the black pigments added are finely divided and form a uniform and dense black pigment coat on the surface of the extender pigments through the gluing agent coating layer by subjecting to the above treatments.

The extender pigments may be previously coated, if required, with at least one undercoating material selected from the group consisting of hydroxides of aluminum, oxides of aluminum, hydroxides of silicon and oxides of silicon, prior to mixing and stirring with the black pigments or with the gluing agent.

The coating with the undercoating material may be conducted by adding an aluminum compound, a silicon compound or both the aluminum and silicon compounds to a water suspension prepared by dispersing the extender pigments in water; and mixing and stirring the resultant suspension, if required, followed by adequately adjusting the pH value thereof, to coat the surface of the extender pigments with at least one undercoating material selected from the group consisting of hydroxides of aluminum, oxides of aluminum, hydroxides of silicon and oxides of silicon. Then, the thus coated particles may be subjected to filtration, water-washing, drying and pulverization. Further, if required, the resultant particles may be subjected to deaeration, compaction or the like.

Examples of the aluminum compound may include aluminum salts such as aluminum acetate, aluminum sulfate, aluminum chloride and aluminum nitrate, alkali aluminates such as sodium aluminate, or the like.

Examples of the silicon compound may include water glass #3, sodium orthosilicate, sodium metasilicate or the like.

Next, the process for producing the solid semiconductor sealing material according to the present invention is described.

The solid semiconductor sealing material of the present invention can be produced by mixing and kneading the black composite particles, the binder resin and the curing agent with each other by known methods. More specifically, the black composite particles, the binder resin and the curing agent are uniformly mixed, if required, together with additives such as curing accelerators, inorganic fillers, colorants, flame retardants, surface-treating agents, mold release agents and antioxidants, using a mixing apparatus, and then the resultant mixture is kneaded using a kneader. If required, after being cooled and solidified, the obtained solid semiconductor sealing material may be formed into a granular shape by pulverization, etc.

As the mixing apparatus, there may be used mixers such as Henschel mixer and ball mill. As the kneader, there may be used roll mill, kneader, twin-screw extruder or the like. The above pulverization may be performed using a pulverizer such as cutter mill and jet mill.

In the case where the solid semiconductor sealing material of the present invention is used to seal semiconductor devices such as IC, LSI, transistors, thyristers and diodes, the sealing treatment may be performed by known methods such as transfer-molding method, injection-molding method and cast-molding method. In this case, the molding temperature of the semiconductor sealing material is usually 150 to 200° C., and the post-curing temperature is usually 150 to 200° C. and the post-curing time is usually 2 to 16 hours.

Next, the process for producing the liquid semiconductor sealing material according to the present invention is described.

The liquid semiconductor sealing material of the present invention can be produced by mixing and kneading the black composite particles, the binder resin and the curing agent with each other by known methods. More specifically, after the black composite particles, the binder resin and the curing agent are uniformly mixed, if required, together with additives such as curing accelerators, inorganic fillers, colorants, flame retardants, surface-treating agents, leveling agents, defoaming agents, stress-relief agents and solvents, using a mixing apparatus, the resultant mixture is kneaded using a kneader and then subjected to vacuum defoaming treatment.

When the liquid semiconductor sealing material of the present invention is used for sealing semiconductor devices such as hybrid IC, chip-on board, tape carrier package, plastic pin grid array and plastic ball grid array without a molding die, the sealing treatment may be performed by known methods such as casting method, injecting method, dipping method, drip-coating method and other coating methods.

The point of the present invention is that the black composite particles for semiconductor sealing material, which comprise the extender pigments and the black pigments adhered onto the surface of the extender pigments, are excellent in not only moisture resistance, blackness, fluidity and tinting strength, but also dispersibility in binder resins.

The reason why the black composite particles for semiconductor sealing material according to the present invention can exhibit an excellent moisture resistance, is considered as follows. That is, it is known that silica particles ordinarily added as inorganic filler to conventional semiconductor sealing materials have silanol (Si—OH) groups on the surface thereof and, therefore, tend to absorb water therein due to hydrogen bonds of the silanol groups. On the contrary, in the case of the black composite particles of the present invention, it is considered that since the black pigments are adhered on the surface of the extender pigments, the obtained particles become more hydrophobic as compared to the extender pigments, i.e., the silica particles solely and, therefore, can be inhibited from absorbing water therein. In particular, in the case of the black composite particles comprising the extender pigments, a gluing agent coating layer formed on the surface of the extender pigments and a black pigment coat formed on the gluing agent coating layer, since the gluing agent coating layer is formed on the surface of the extender pigments and the black pigment coat is formed on the gluing agent coating layer, it is considered that the surface of the extender pigment is uniformly coated with the gluing agent coating layer, and the black pigments are strongly adhered onto the surface of the extender pigments through the gluing agent coating layer, thereby more effectively preventing the black pigments from being desorbed therefrom.

The reason why the black composite particles for semiconductor sealing material according to the present invention can exhibit an excellent fluidity, is considered to be that the extender pigments such as silica particles which have an excellent fluidity are used as the core particles, and that the standard deviation value of volume particle diameter (behavior particle diameter) of the black composite particles can be reduced to not more than 2.00 by subjecting the particles to pulverization and classification.

Another point of the present invention is that the black composite particles for semiconductor sealing material comprising the extender pigments, a gluing agent coating layer formed on the surface of the extender pigments, which has a reactive group capable of bonding and hydrolyzing with hydroxy groups existing on the surface of the extender pigments, and a black pigment coat formed on the gluing agent coating layer, and exhibiting a standard deviation value of volume particle diameter of not more than 2.00, have a low water content and are excellent in not only moisture resistance, blackness, fluidity and tinting strength, but also dispersibility in binder resins.

The reason why the black composite particles for semiconductor sealing material according to the present invention can show a low water content, is considered as follows. That is, it is known that silica particles ordinarily added as inorganic filler to conventional semiconductor sealing materials have a high water content due to hydroxy groups existing on the surface thereof. On the contrary, in the case of the black composite particles of the present invention, it is considered that since the surface of the extender pigments is coated with the gluing agent having a reactive group capable of bonding and hydrolyzing with the hydroxy groups existing on the surface thereof, the amount of the hydroxy groups on the surface of the extender pigments can be considerably reduced.

Thus, the black composite particles for semiconductor sealing material according to the present invention have a low water content and are excellent in not only moisture resistance, blackness, fluidity and tinting strength, but also dispersibility in binder resins. Therefore, the black composite particles of the present invention can be suitably used for semiconductor sealing materials.

Also, the semiconductor sealing material of the present invention can exhibit a high volume resistivity value and are excellent in moisture resistance, blackness, soldering heat resistance and flexural strength by using therein the above black composite particles for semiconductor sealing material and, therefore, are suitable as a semiconductor sealing material.

Further, the black composite particles comprising the extender pigments, a gluing agent coating layer formed on the surface of the extender pigments and a carbon black coat formed on the gluing agent coating layer according to the present invention, are excellent in not only blackness, moisture resistance, fluidity and tinting strength, but also dispersibility in binder resins and, therefore, can be suitably used for liquid semiconductor sealing materials.

In addition, the liquid semiconductor sealing material of the present invention can exhibit a low viscosity and a high volume resistivity value as well as excellent blackness, moisture resistance and flexural strength and, therefore, can be suitably used as a liquid semiconductor sealing material.

EXAMPLES

The present invention is described in more detail by Examples and Comparative Examples, but the Examples are only illustrative and, therefore, not intended to limit the scope of the present invention.

Various properties were measured by the following methods.

(1) The primary average particle diameter of the particles was expressed by an average value of particle. diameters of 350 particles measured on a micrograph (×50,000 in the case where the primary average particle diameter was less than 0.1 μm; ×30,000 in the case where the primary average particle diameter was 0.1 to 0.5 µm; ×20,000 in the case where the primary average particle diameter was 0.5 to 1.0 µm; and ×10,000 in the case where the primary average particle diameter was more than 1.0 µm).

(2) The sphericity was expressed by the ratio of primary average particle diameter (primary average maximum diameter) to primary average minimum diameter.

(3) The volume average particle diameter ($D_{50}$) and the volume maximum particle diameter ($D_{99}$) of the particles were measured by a laser diffraction-type particle size distribution measuring device "Model HELOSLA/KA" (manufactured by Sympatec Co., Ltd.). Meanwhile, $D_{50}$ represents the particle diameter at which an accumulative volume of particles was 50% when measured based on a total volume of whole particles as 100%, and $D_{99}$ represents the particle diameter at which an accumulative volume of particles was 99% when measured based on a total volume of whole particles as 100%.

(4) The standard deviation value of volume particle diameter of the particles was determined from the particle size distribution measured by the above laser diffraction-type particle size distribution measuring device "Model HELOSLA/KA" (manufactured by Sympatec Co., Ltd.). The closer to 1 the standard deviation value, the more excellent the particle size distribution of the behavior particle diameter.

(5) The specific surface area of the particles was expressed by the value measured by a BET method.

(6) The amounts of Al and Si existing on the surface of extender pigments coated with an undercoating material, were respectively measured by a fluorescent X-ray spectroscopy device "3063 M-type" (manufactured by RIGAKU DENKI KOGYO CO., LTD.) according to JIS K0119 "General rule of fluorescent X-ray analysis".

(7) The amount of the gluing agent coated on the surface of the extender pigments and the amount of the black pigments adhered onto the surface of the extender pigments were respectively expressed by the amount of carbon measured by "Horiba Metal, Carbon and Sulfur Analyzer EMIA-2200 Model" (manufactured by HORIBA SEISAKUSHO CO., LTD.).

(8) The water contents of the extender pigments, the intermediate particles and the black composite particles were respectively measured by "Trace Water Measuring Device AQ-7" manufactured by HIRAMUMA SANGYO CO., LTD.

(9) The fluidity of the extender pigments and the black composite particles was determined as follows. That is, various particle characteristics including repose angle (°), compression percentage (%), spatula angle (°) and agglomeration degree were measured using "Powder Tester" (tradename, manufactured by Hosokawa Micron Co., Ltd.). The thus measured values were respectively converted into the same standard values to obtain indices thereof. The fluidity was expressed by a fluidity index obtained as a sum of these indices. The closer to 100 the fluidity index, the more excellent the fluidity of the particles.

(10) The hue of the extender pigments and the blackness of the black composite particles and the black pigment were respectively measured by the following method.

That is, 0.5 g of each sample and 1.5 ml of castor oil were intimately kneaded together by a Hoover's muller to form a paste. 4.5 g of clear lacquer was added to the obtained paste and was intimately kneaded to form a paint. The obtained paint was applied on a cast-coated paper by using a 150 µm (6-mil) applicator to produce a coating film piece (coating film thickness: about 30 µm). The thus obtained coating film piece was measured by a multi-spectro-colour-meter "MSC-IS-2D" (manufactured by SUGA SHIKENKI CO., LTD.) according to JIS Z 8729 to determine L*, a* and b* values for the hue, and L* value for the blackness, respectively. Here, the L* value represents lightness, and the smaller the L* value, the more excellent the blackness. Meanwhile, the C* value represents chroma and is calculated according to the following formula:

$$C^* = ((a^*)^2 + (b^*)^2)^{1/2}$$

(11) The tinting strength of the black composite particles was measured by the following method.

That is, a primary color enamel and a vehicle enamel prepared by the below-mentioned method were respectively applied on a cast-coated paper by a 150 µm (6-mil) applicator to produce coating film pieces. The thus obtained coating film pieces were measured by a multi-spectro-colour-meter "MSC-IS-2D" (manufactured by SUGA SHIKENKI CO., LTD.) to determine L* values thereof according to JIS Z 8729. The difference between the thus measured L* values was represented by ΔL*.

Next, as a control sample for black composite particles, mixed pigments were prepared by simply mixing the black pigments and the extender pigments at the same mixing ratio as used for the production of the above black composite particles. Using the thus prepared mixed pigments as a control sample, a primary color enamel and a vehicle enamel were prepared by the same method as described above to form coating film pieces and measure L* values thereof. The difference between the thus measured L* values was represented by ΔLs*.

Using the ΔL* value for the black composite particles and the ΔLs* value for the control sample, the tinting strength (%) was calculated according to the following formula:

$$\text{Tinting strength (\%)} = 100 + \{(\Delta Ls^* - \Delta L^*) \times 10\}$$

Preparation of Primary Color Enamel:

10 g of the above sample particles, 16 g of an amino alkyd resin and 6 g of a thinner were blended together. The resultant mixture was added together with 90 g of 3 mmφ glass beads into a 140-ml glass bottle, and then mixed and dispersed for 45 minutes by a paint shaker. The obtained mixture was mixed with 50 g of an amino alkyd resin, and further dispersed for 5 minutes by a paint shaker, thereby obtaining a primary color enamel.

Preparation of Vehicle Enamel:

12 g of the above-prepared primary color enamel and 40 g of Aramic White (titanium dioxide-dispersed amino alkyd resin) were blended together, and the resultant mixture was mixed and dispersed for 15 minutes by a paint shaker, thereby preparing a vehicle enamel.

(12) The moisture resistance of the black pigments was measured as follows. That is, sample particles were allowed to stand at a temperature of 85° C. and a relative humidity of 85% for 48 hours. The weights of the black pigments before and after the standing test were measured to determine the increase in weight thereof. The moisture resistance of the black pigments was expressed by the increased weight as the water content (weight part) based on 100 parts by weight of the black pigments.

(13) The moisture resistance of the black composite particles was measured as follows. That is, sample particles were allowed to stand at a temperature of 85° C. and a relative humidity of 85% for 48 hours. The weights of the black composite particles before and after the standing test were measured, and the moisture resistance of the black composite particles was calculated from the following formula:

$$\text{Moisture resistance (\%)} = \{(W_a - W_e)/W_a\} \times 100$$

wherein $W_a$ represents a weight of sample particles before the standing test; and $W_e$ represents a weight of sample particles after the standing test.

(14) The desorption degree of the black pigments adhered onto the extender pigments was evaluated by classifying the results of visual observation thereof into the following five ranks by the following method. The rank 5 represents that the amount of the black pigments desorbed was smallest.

2 g of the particles to be measured and 20 ml of ethanol were placed in a 50-ml conical flask and then subjected to ultrasonic dispersion for 60 minutes. Thereafter, the obtained dispersion was centrifuged at a rotating speed of 10,000 rpm for 15 minutes to separate the particles from the solvent. The obtained particles were dried at 80° C. for one hour, and the micrograph (×50,000) thereof was visually observed to count the number of the desorbed and re-agglomerated black pigment particles existing in visual field of the micrograph. The micrograph was compared with a micrograph (×50,000) of mixed particles as control particles obtained by simply mixing the extender pigments with the black pigments without forming a gluing agent coating layer. The results are classified into the following five ranks.

Rank 1: Number of desorbed and re-agglomerated particles was substantially the same as that in the simply mixed particles as control particles;
Rank 2: 30 to 49 desorbed and re-agglomerated particles per 100 black composite particles were recognized;
Rank 3: 10 to 29 desorbed and re-agglomerated particles per 100 black composite particles were recognized;
Rank 4: 5 to 9 desorbed and re-agglomerated particles per 100 black composite particles were recognized; and
Rank 5: 0 to 4 desorbed and re-agglomerated particles per 100 black composite particles were recognized.

(15) The desorption percentage (%) of the black pigments adhered onto the extender pigment was expressed by the value measured by the following method. The closer to 0% the desorption percentage, the smaller the amount of the black pigments desorbed from the surface of the black composite particles.

That is, 3 g of the particles to be measured and 40 ml of ethanol were placed in a 50-ml precipitation tube and then subjected to ultrasonic dispersion for 20 minutes. Thereafter, the obtained dispersion was allowed to stand for 120 minutes, and the black pigments desorbed was separated from the black composite particles by the difference in specific gravity therebetween. Next, the thus separated black composite particles were mixed again with 40 ml of ethanol, and the resultant mixture was subjected to ultrasonic dispersion for 20 minutes. Thereafter, the obtained dispersion was allowed to stand for 120 minutes to separate the desorbed black pigments from the black composite particles. After the thus separated black composite particles were dried at 100° C. for one hour, the amount of carbon contained therein was measured by "Horiba Metal, Carbon and Sulfur Analyzer EMIA-2200 Model" (manufactured by HORIBA SEISAKUSHO CO., LTD.). The desorption percentage (%) of the black pigments was calculated according to the following formula:

$$\text{Desorption Percentage (\%) of black pigments} = \{(Y_a - Y_e)/Y_a\} \times 100$$

wherein $Y_a$ represents an amount of black pigments initially adhered; and $Y_e$ represents an amount of black pigments still adhered onto the black composite particles after the desorption test.

(16) The dispersibility of the black composite particles in the binder resin for the solid semiconductor sealing material was measured as follows. The cross-section of the semiconductor sealing material prepared by the below-mentioned method was photographed by an optical microscope "BH-2" (manufactured by Olympus Kogaku Kogyo Co., Ltd.). The obtained micrograph (×200) was observed to count the number of undispersed aggregate particles thereon, and the results were classified into the following five ranks. The rank 5 represents the most excellent dispersing condition.

Rank 5: No undispersed aggregate particles were recognized.
Rank 4: 1 to 4 undispersed aggregate particles per 0.25 mm$^2$ were recognized;
Rank 3: 5 to 9 undispersed aggregate particles per 0.25 mm$^2$ were recognized;
Rank 2: 10 to 49 undispersed aggregate particles per 0.25 mm$^2$ were recognized;
Rank 1: Not less than 50 undispersed aggregate particles per 0.25 mm$^2$ were recognized.

(17) The dispersibility of the black composite particles in the binder resin for the liquid semiconductor sealing material was measured as follows. That is, the liquid semiconductor sealing material prepared by the below-mentioned method was applied onto a plastic substrate and cured at 150° C. for 2 hours to obtain a resin plate. The cross-section of the thus obtained resin plate was photographed by an optical microscope "BH-2" (manufactured by Olympus Kogaku Kogyo Co., Ltd.). The obtained micrograph (×200) was observed to count the number of undispersed aggregate particles thereon, and the dispersibility was evaluated according to the same criteria as used for the above solid semiconductor sealing material.

(18) The viscosity of the liquid semiconductor sealing material was measured by a KOKA-type flow tester using a die of 1 mmφ×10 mm and a plunger having an effective area of 100 mm$^2$ at 175° C. under a load of 98 N.

(19) The blackness of the solid semiconductor sealing material was expressed by the L* value of the resin plate prepared by the below-mentioned method which was measured by a multi-spectro-colour-meter "MSC-IS-2D" (manufactured by SUGA SHIKENKI CO., LTD.) according to JIS Z 8729.

(20) The blackness of the liquid semiconductor sealing material was measured as follows. That is, the liquid semiconductor sealing material prepared by the below-mentioned method was applied onto a plastic substrate and cured at 150° C. for 2 hours to obtain a resin plate. The thus obtained resin plate was measured by a multi-spectro-colour-meter "MSC-IS-2D" (manufactured by SUGA SHIKENKI CO., LTD.) to determine the L* value thereof according to JIS Z 8729. The blackness was expressed by the measured L* value.

(21) The moisture resistance of the semiconductor sealing material was measured as follows. That is, the resin plate prepared by the below-mentioned method was allowed to stand at a temperature of 85° C. and a relative humidity of 85% for 48 hours. The weights of the resin plate before and after the standing test were measured, and the moisture resistance of the resin plate was calculated from the following formula:

Moisture resistance (%)=$\{(W_{a'}-W_{e'})/W_{a'}\}\times 100$ wherein $W_{a'}$ represents a weight of the resin plate before the standing test; and $W_{e'}$ represents a weight of the resin plate after the standing test.

(22) The soldering heat resistance of the semiconductor sealing material was measured as follows. That is, the resin composition prepared by the below-mentioned method was formed into pellets, and the obtained pellets were molded using a low-pressure transfer-molding machine at 175° C. under a pressure of 70 kg/cm$^2$ (6.9 Mpa) and cured for 2 minutes. The thus obtained molded product was further post-cured at 175° C. for 8 hours to obtain a 160pQFP chip (28×28 mm; 3.0 mm in thickness). The chip was allowed to stand at a temperature of 85° C. and a relative humidity of 85% for 7 days, and then heat-treated at 240° C. for 10 seconds. Thereafter, the chip was observed to examine whether or not any external cracks were caused therein, using an optical microscope. The total number of cracks per 20 packages was counted and classified into the following five ranks. The rank 5 represents the most excellent soldering heat resistance.

Rank 5: No cracks per 20 packages were recognized;
Rank 4: 1 to 2 cracks per 20 packages were recognized;
Rank 3: 3 to 6 cracks per 20 packages were recognized;
Rank 2: 7 to 10 cracks per 20 packages were recognized; and
Rank 1: Not less than 11 cracks per 20 packages were recognized.

(23) The volume resistivity value of the solid semiconductor sealing material was measured using a cylindrical test specimen produced by blanking the resin plate obtained by the below-mentioned method into a cylindrical shape.

Also, the volume resistivity value of the liquid semiconductor sealing material was measured using a cylindrical test specimen produced by blanking the same resin plate as prepared and used for evaluating the blackness of the liquid semiconductor sealing material into a cylindrical shape.

Next, the thus prepared test specimen was exposed to the environmental condition at a temperature of 25° C. and a relative humidity of 60% for not less than 12 hours, and then set between a pair of stainless steel electrodes. The test specimen was applied with a voltage of 15 V by using a Wheastone bridge ("TYPE 2768" manufactured by Yokogawa Hokushin Denki Co., Ltd.) to measure a resistance value R ($\Omega$) thereof.

Then, a top surface area A (cm$^2$) and a thickness t (cm) of the cylindrical test specimen were measured, and the volume resistivity value X ($\Omega\cdot$cm) thereof was calculated by inserting the measured values into the following formula:

Volume Resistivity Value ($\Omega\cdot$cm)=$R\times(A/t)$

(24) The flowability of the semiconductor sealing material was determined by measuring the spiral flow value at 175° C. and 6.9 MPa according to EMMI standard using a transfer-molding machine.

(25) The flexural strength of the solid semiconductor sealing material was measured according to JIS K6911 as follows. That is, the solid semiconductor sealing material was molded into a bar-shaped transverse test piece of 10×4×100 mm at 175° C. and 6.9 MPa for 2 minutes, and post-cured at 180° C. for 4 hours. The thus obtained test piece was tested to measure the flexural strength thereof at room temperature.

(26) The flexural strength of the liquid semiconductor sealing material was measured according to JIS K6911 as follows. That is, the liquid semiconductor sealing material was molded into a bar-shaped transverse test piece of 10×4×100 mm at 175° C. and 6.9 MPa for 2 minutes, and cured at 150° C. for 2 hours. The thus obtained test piece was tested to measure the flexural strength thereof at room temperature.

Example 1

<Production of Black Composite Particles (I)>

Silica particles (particle shape: spherical shape; primary average particle diameter: 0.45 μm; sphericity: 1.02; BET specific surface area value: 5.4 m$^2$/g; fluidity index: 52; L* value: 93.1; a* value: 0.4; b* value: 0.3; C* value: 0.5) and black pigments (kind: carbon black (furnace black); particle shape: granular shape; primary average particle diameter: 0.022 μm; BET specific surface area value: 133.5 m$^2$/g; L* value: 14.6) were previously mixed with each other such that the amount of the black pigments mixed was 10 parts by weight (calculated as C) based on 100 parts of the silica particles. The resultant mixture was charged into Mechanofusion AMS-Lab (manufactured by Hosokawa Micron Co., Ltd.) and subjected to mechanochemical reaction, thereby obtaining black composite particles (I) comprising the black pigment coat formed on the surface of the silica particles.

The obtained black composite particles (I) were spherical particles having an primary average particle diameter of 0.45 μm and a sphericity of 1.04, and had a BET specific surface area value of 11.4 m$^2$/g, a fluidity index of 57, a blackness (L* value) of 17.1, a tinting strength of 115%, a moisture resistance of 0.27% and a desorption degree of black pigments of the rank 3. Further, it was confirmed that the amount of the black pigments adhered was 8.94% by weight (calculated as C; corresponding to 10 parts by weight based on 100 parts by weight of the silica particles).

<Production of Semiconductor Sealing Material (I)>

2.0 parts by weight of the above black composite particles (I), 14.5 parts by weight of an epoxy resin, 78.0 parts by weight of silica particles (particle shape: spherical shape; primary average particle diameter: 0.45 μm; sphericity: 1.02; BET specific surface area value: 5.4 m$^2$/g), 5.0 parts by weight of a phenol novolak resin, 0.2 part by weight of a curing accelerator and 0.3 part by weight of a mold release agent were charged into a Henschel mixer, and then stirred and mixed therein at 60° C. for 15 minutes. The obtained mixed particles were kneaded by a continuous-type twin-screw kneader. Then, the obtained kneaded material was cooled in air, coarsely pulverized and finely pulverized, thereby obtaining a semiconductor sealing material (I).

The thus obtained semiconductor sealing material (I) had a dispersibility of the rank 4, a blackness (L* value) of 19.6, a volume resistivity value of 1.8×10$^9$ $\Omega\cdot$cm, a moisture resistance of 0.16%, a spiral flow value of 94 cm and a flexural strength of 158 MPa.

Example 2

<Production of Black Composite Particles (II)>

70 g of methyl hydrogen polysiloxane (tradename "TSF484", produced by GE TOSHIBA SILICONE CO., LTD.) was added to 7.0 kg of silica particles (particle shape: spherical shape; primary average particle diameter: 0.45 µm; sphericity: 1.02; BET specific surface area value: 5.4 m²/g; fluidity index: 52; L* value: 93.1; a* value: 0.4; b* value: 0.3; C* value: 0.5) while operating an edge runner. The resultant mixture was mixed and stirred at a linear load of 588 N/cm (60 Kg/cm) and a stirring speed of 22 rpm for 30 minutes, thereby forming a methyl hydrogen polysiloxane coating layer on the surface of the silica particles.

Next, 700 g of black pigments (kind: carbon black (furnace black); particle shape: granular shape; primary average particle diameter: 0.022 µm; BET specific surface area value: 133.5 m²/g; L* value: 14.6) was added to the above obtained particles for 30 minutes while operating the edge runner. Further, the obtained mixture was continuously mixed and stirred at a linear load of 588 N/cm (60 Kg/cm) and a stirring speed of 22 rpm for 30 minutes to adhere the black pigments on the methyl hydrogen polysiloxane coating layer. Then, the thus obtained particles were dried at 80° C. for 60 minutes using a drier, thereby obtaining black composite particles (II).

The obtained black composite particles (II) were spherical particles having an primary average particle diameter of 0.45 µm and a sphericity of 1.03, and had a BET specific surface area value of 10.8 m²/g, a fluidity index of 66, a blackness (L* value) of 16.6, a tinting strength of 128%, a moisture resistance of 0.19% and a desorption degree of black pigments of the rank 5. Further, it was confirmed that the amount of the methyl hydrogen polysiloxane coating layer was 0.26% by weight (calculated as C), and the amount of the black pigments adhered was 9.02% by weight (calculated as C; corresponding to 10 parts by weight based on 100 parts by weight of the silica particles).

As a result of observing the micrograph of the obtained black composite particles (II), since substantially no black pigments were recognized from the micrograph, it was confirmed that a substantially whole amount of the black pigments used contributed to the formation of the black pigment coat on the methyl hydrogen polysiloxane coating layer.

<Production of Semiconductor Sealing Material (II)>

2.0 parts by weight of the above black composite particles (II), 14.5 parts by weight of an epoxy resin, 78.0 parts by weight of silica particles (particle shape: spherical shape; primary average particle diameter: 0.45 µm; sphericity: 1.02; BET specific surface area value: 5.4 m²/g), 5.0 parts by weight of a phenol novolak resin, 0.2 part by weight of a curing accelerator and 0.3 part by weight of a mold release agent were charged into a Henschel mixer, and then stirred and mixed therein at 60° C. for 15 minutes. The obtained mixed particles were kneaded by a continuous-type twin-screw kneader. Then, the obtained kneaded material was cooled in air, coarsely pulverized and finely pulverized, thereby obtaining a semiconductor sealing material (II).

The thus obtained semiconductor sealing material (II) had a dispersibility of the rank 5, a blackness (L* value) of 18.9, a volume resistivity value of 2.5×10¹⁰ Ω·cm, a moisture resistance of 0.08%, a spiral flow value of 102 cm and a flexural strength of 162 MPa.

Example 3

<Production of Black Composite Particles (III)>

70 g of methyl hydrogen polysiloxane (tradename "TSF484", produced by GE TOSHIBA SILICONE CO., LTD.) was added to 7.0 kg of silica particles (particle shape: spherical shape; primary average particle diameter: 3.22 µm; sphericity: 1.02; BET specific surface area value: 0.8 m²/g; fluidity index: 48; L* value: 93.2; a* value: 0.4; b* value: 0.6; C* value: 0.7) while operating an edge runner. The resultant mixture was mixed and stirred at a linear load of 588 N/cm (60 Kg/cm) and a stirring speed of 22 rpm for 30 minutes, thereby forming a methyl hydrogen polysiloxane coating layer on the surface of the silica particles.

Next, 700 g of carbon black (particle shape: granular shape; primary average particle diameter: 0.022 µm; BET specific surface area value: 133.5 m²/g; L* value: 14.6) was added to the above obtained particles for 30 minutes while operating the edge runner. Further, the obtained mixture was continuously mixed and stirred at a linear load of 588 N/cm (60 Kg/cm) and a stirring speed of 22 rpm for 30 minutes to adhere the carbon black onto the methyl hydrogen polysiloxane coating layer. Then, the thus obtained particles were dried at 80° C. for 60 minutes using a drier, thereby obtaining black composite particles (III).

The obtained black composite particles (III) were granular particles having a particle diameter of 3.22 µm and a sphericity of 1.03, and had a BET specific surface area value of 4.1 m²/g, a fluidity index of 74, a blackness (L* value) of 18.4, a tinting strength of 126%, a moisture resistance of 0.21% and a desorption degree of carbon black of the rank 4. Further, it was confirmed that the amount of the methyl hydrogen polysiloxane coating layer was 0.27% by weight (calculated as C), and the amount of the carbon black adhered was 9.04% by weight (calculated as C; corresponding to 10 parts by weight based on 100 parts by weight of the silica particles).

As a result of observing the micrograph of the obtained black composite particles (III), since substantially no carbon black particles were recognized from the micrograph, it was confirmed that a substantially whole amount of the carbon black added contributed to the formation of a carbon black coat on the methyl hydrogen polysiloxane coating layer.

<Production of Liquid Semiconductor Sealing Material (I)>

2.0 parts by weight of the above black composite particles (III), 14.0 parts by weight of a bisphenol A-type epoxy resin, 68.2 parts by weight of silica particles (particle shape: spherical shape; primary average particle diameter: 3.22 µm; sphericity: 1.02; BET specific surface area value: 0.8 m²/g), 10.0 parts by weight of methylhexahydrophthalic anhydride, 0.5 part by weight of a curing accelerator and 5.3 part by weight of a silane-based coupling agent were mixed with each other in a universal mixer, and then defoamed in a vacuum chamber, thereby obtaining a liquid semiconductor sealing material (I).

The thus obtained liquid semiconductor sealing material (I) had a viscosity of 426 Pa·s, a dispersibility of the rank 5, a blackness (L* value) of 20.6, a volume resistivity value of 2.4×10¹⁰ Ω·cm, a moisture resistance of 0.10% and a flexural strength of 104 MPa.

Example 4

<Production of Black Composite Particles (IV)>

350 g of methyl hydrogen polysiloxane (tradename "TSF484", produced by GE TOSHIBA SILICONE CO., LTD.) was added to 7.0 kg of silica particles (particle shape: spherical shape; primary average particle diameter: 0.45 µm; sphericity: 1.02; BET specific surface area value: 5.4 m²/g; water content: 3.02% by weight; fluidity index: 52; L* value: 93.1; a* value: 0.4; b* value: 0.3; C* value: 0.5) while operating an edge runner. The resultant mixture was mixed and stirred at a linear load of 588 N/cm (60 Kg/cm) and a stirring speed of 22 rpm for 30 minutes, thereby obtaining intermediate particles. It was confirmed that the amount of the methyl hydrogen polysiloxane coating layer formed on the thus obtained intermediate particles was 1.25% by weight (calculated as C), and the water content thereof was 1.82% by weight.

Next, 700 g of black pigments (kind: carbon black; particle shape: granular shape; primary average particle diameter: 0.02 µm; BET specific surface area value: 133.5 m²/g; water content (moisture resistance): 0.80 parts by weight; L* value: 14.6) were added to the above obtained particles for 30 minutes while operating the edge runner. Further, the obtained mixture was continuously mixed and stirred at a linear load of 588 N/cm (60 Kg/cm) and a stirring speed of 22 rpm for 30 minutes to adhere the black pigments on the methyl hydrogen polysiloxane coating layer. Then, the thus obtained particles were pulverized and classified using a fluidized bed-type jet mill and a centrifugal separator, respectively, and then dried at 120° C. for 60 minutes using a drier, thereby obtaining black composite particles (IV).

The obtained black composite particles (IV) were spherical particles having a primary average particle diameter of 0.45 µm, a sphericity of 1.03, a volume average particle diameter ($D_{50}$) of 1.10 µm, a volume maximum particle diameter ($D_{99}$) of 3.10 µm and a standard deviation value of volume particle diameter of 1.09, and had a BET specific surface area value of 11.2 m²/g, a fluidity index of 73, a water content of 0.43% by weight, a moisture resistance of 0.07%, a blackness (L* value) of 17.6, a tinting strength of 129%, and a desorption percentage of black pigments of 5.0%. Further, it was confirmed that the amount of the black pigments adhered was 9.03% by weight (calculated as C; corresponding to 10 parts by weight based on 100 parts by weight of the silica particles).

As a result of observing the micrograph of the obtained black composite particles (IV), since substantially no black pigments were recognized from the micrograph, it was confirmed that a substantially whole amount of the black pigments used contributed to the formation of a black pigment coat on the methyl hydrogen polysiloxane coating layer.

<Production of Solid Semiconductor Sealing Material (III)>

2.2 parts by weight of the above black composite particles (IV), 14.5 parts by weight of an epoxy resin, 77.8 parts by weight of the above intermediate particles, 5.0 parts by weight of a phenol novolak resin, 0.2 part by weight of a curing accelerator and 0.3 part by weight of a mold release agent were charged into a Henschel mixer, and then stirred and mixed therein at 60° C. for 15 minutes. The thus obtained mixed particles were kneaded by a continuous-type twin-screw kneader. The obtained kneaded material was cooled in air, coarsely pulverized and finely pulverized, thereby obtaining a semiconductor sealing material (III).

The thus obtained semiconductor sealing material (III) was molded into a test piece to evaluate various properties thereof.

As a result, it was confirmed that the obtained semiconductor sealing material (III) had a dispersibility of the rank 5, a blackness (L* value) of 19.5, a soldering heat resistance of the rank 5, a volume resistivity value of $5.3 \times 10^{10}$ Ω·cm, a spiral flow value of 105 cm and a flexural strength of 166 MPa.

Example 5

<Production of Black Composite Particles (V)>

350 g of methyl hydrogen polysiloxane (tradename "TSF484", produced by GE TOSHIBA SILICONE CO., LTD.) was added to 7.0 kg of silica particles (particle shape: spherical shape; primary average particle diameter: 3.22 µm; sphericity: 1.02; BET specific surface area value: 0.8 m²/g; water content: 2.95% by weight; fluidity index: 48; L* value: 93.2; a* value: 0.4; b* value: 0.6; C* value: 0.7) while operating an edge runner. The resultant mixture was mixed and stirred at a linear load of 588 N/cm (60 Kg/cm) for 30 minutes, thereby obtaining intermediate particles. It was confirmed that the amount of the methyl hydrogen polysiloxane coating layer formed on the thus obtained intermediate particles was 1.25% by weight (calculated as C), and the water content thereof was 1.75% by weight.

Next, 700 g of black pigments (kind: carbon black; particle shape: granular shape; primary average particle diameter: 0.02 µm; BET specific surface area value: 133.5 m²/g; water content (moisture resistance): 0.80 parts by weight; L* value: 14.6) were added to the above obtained particles for 30 minutes while operating the edge runner. Further, the obtained mixture was continuously mixed and stirred at a linear load of 588 N/cm (60 Kg/cm) and a stirring speed of 22 rpm for 30 minutes to adhere the black pigments on the methyl hydrogen polysiloxane coating layer. Then, the thus obtained particles were pulverized and classified using a fluidized bed-type jet mill and a centrifugal separator, respectively, and then dried at 120° C. for 60 minutes using a drier, thereby obtaining black composite particles (V).

The obtained black composite particles (V) were granular particles having a primary average particle diameter of 3.22 um, a sphericity of 1.03, a volume average particle diameter ($D_{50}$) of 3.90 µm, a volume maximum particle diameter ($D_{99}$) of 7.05 µm and a standard deviation value of volume particle diameter of 1.17, and had a BET specific surface area value of 8.4 m²/g, a fluidity index of 74, a water content of 0.40% by weight, a moisture resistance of 0.08%, a blackness (L* value) of 18.3, a tinting strength of 126%, and a desorption percentage of black pigments of 5.3%. Further, it was confirmed that the amount of the black pigments adhered was 9.04% by weight (calculated as C; corresponding to 10 parts by weight based on 100 parts by weight of the silica particles).

As a result of observing the micrograph of the obtained black composite particles (V), since substantially no black pigments were recognized from the micrograph, it was confirmed that a substantially whole amount of the black pigments used contributed to the formation of a black pigment coat on the methyl hydrogen polysiloxane coating layer.

<Production of Liquid Semiconductor Sealing Material (II)>

2.2 parts by weight of the above black composite particles (V), 14.0 parts by weight of a bisphenol A-type epoxy resin, 67.8 parts by weight of the above intermediate particles, 10.0 parts by weight of methylhexahydrophthalic anhydride, 0.5 part by weight of a curing accelerator and 5.3 part by weight of a silane-based coupling agent were mixed in a universal mixer, and then defoamed in a vacuum chamber, thereby obtaining a liquid semiconductor sealing material (II).

The thus obtained liquid semiconductor sealing material (II) was molded into a test piece to evaluate various properties thereof.

As a result, it was confirmed that the obtained liquid semiconductor sealing material (II) had a viscosity of 390 Pa·s, a dispersibility of the rank 5, a blackness (L* value) of 20.4, a volume resistivity value of $3.7 \times 10^{10}$ Ω·cm and a flexural strength of 106 MPa.

Core Particles 1 to 5:

Extender pigments as core particles 1 to 5 having properties shown in Table 1 were prepared.

Core Particles 6:

A slurry containing silica particles was obtained by dispersing 20 kg of silica particles as core particles 1 in 150 liters of water. The pH value of the thus obtained dispersed slurry containing the silica particles was adjusted to 10.5. Then, the concentration of the slurry was adjusted to 98 g/liter by adding water thereto. After 150 liters of the slurry was heated to 60° C., 2,722 ml of a 1.0 mol/liter $NaAlO_2$ solution (corresponding to 0.5% by weight (calculated as Al) based on the weight of the silica particles) was added to the slurry. After allowing the obtained slurry to stand for 30 minutes, the pH value of the slurry was adjusted to 7.5 by using acetic acid. After further allowing the resultant slurry to stand for 30 minutes, the slurry was subjected to filtration, washing with water, drying and pulverization, thereby obtaining the silica particles whose surface was coated with hydroxides of aluminum.

Various properties of the obtained silica particles coated with hydroxides of aluminum are shown in Table 3.

Core Particles 7 to 10:

The same procedure as defined for the production of the above core particles 6, was conducted except that kinds of core particles and kinds and amounts of additives added in the surface-treating step were changed variously, thereby obtaining surface-treated extender pigments.

The essential treatment conditions are shown in Table 2, and various properties of the obtained surface-treated extender pigments are shown in Table 3. Meanwhile, in Tables, "A" as described in "kind of coating material used in surface-treating step" represents hydroxides of aluminum.

Black Pigments A to C:

Black pigments having properties as shown in Table 4 were prepared.

Example 6

Silica particles as core particles 2 and black pigments A were previously mixed with each other such that the amount of the black pigments A mixed was 20 parts by weight (calculated as C) based on 100 parts of the silica particles. The resultant mixture was charged into Mechanofusion AMS-Lab (manufactured by Hosokawa Micron Co., Ltd.) and subjected to mechanochemical reaction, thereby obtaining black composite particles comprising the black pigments A adhered onto the surface of the core particles 2. Various properties of the obtained black composite particles are shown in Table 6.

Examples 7 to 10 and Comparative Examples 1 to 3

The same procedure as defined in Example 2 was conducted except that kinds of core particles, kinds and amounts of additives added in the gluing agent coating step, linear load and treating time for edge runner treatment used in the gluing agent coating step, kinds and amounts of black pigments adhered in the black pigment-adhering step, and linear load and treating time for edge runner treatment used in the black pigment-adhering step, were changed variously, thereby obtaining black composite particles.

The essential production conditions are shown in Table 5, and various properties of the obtained black composite particles are shown in Table 6.

As a result of observing the micrograph of the black composite particles obtained in Comparative Examples 1 and 2, it was confirmed that the black pigments added were present in the form of a simple mixture with the core particles.

Examples 11 to 15 and Comparative Examples 4 to 8

The same procedure as defined in Example 1 was conducted except that kinds and amounts of black composite particles, and kinds and amounts of inorganic fillers were changed variously, thereby obtaining semiconductor sealing materials.

The essential production conditions and various properties of the obtained semiconductor sealing materials are shown in Table 7.

Examples 16 to 19 and Comparative Example 9

The same procedure as defined in Example 3 was conducted except that kinds of core particles, kinds and amounts of additives added in the gluing agent coating step, linear load and treating time for edge runner treatment used in the gluing agent coating step, kinds and amounts of carbon black adhered in the carbon black-adhering step, and linear load and treating time for edge runner treatment used in the carbon black-adhering step, were changed variously, thereby obtaining black composite particles.

The essential production conditions are shown in Table 8, and various properties of the obtained black composite particles are shown in Table 9.

Examples 20 to 23 and Comparative Examples 10 to 12

The same procedure as defined in Example 3 was conducted except that kinds and amounts of black composite particles, and kinds and amounts of inorganic fillers were changed variously, thereby obtaining liquid semiconductor sealing materials.

The essential production conditions and various properties of the obtained liquid semiconductor sealing materials are shown in Table 10.

Intermediate Particles 1 to 12:

The same procedure as defined in Example 4 was conducted except that kinds of core particles, kinds and amounts of additives added in the gluing agent coating step, and linear load and treating time for edge runner treatment used in the gluing agent coating step were changed variously, thereby obtaining intermediate particles.

The essential treatment conditions and various properties of the obtained intermediate particles are shown in Table 11.

Examples 24 to 33 and Comparative Examples 13 and 14

The same procedure as defined in Example 4 was conducted except that kinds of intermediate particles, kinds and amounts of black pigments adhered in the black pigment-adhering step, and linear load and treating time for edge runner treatment used in the black pigment-adhering step, were changed variously, thereby obtaining black composite particles.

The essential production conditions are shown in Table 12, and various properties of the obtained black composite particles are shown in Table 13.

Examples 34 to 45 and Comparative Examples 15 to 17

The same procedure as defined in Example 4 was conducted except that kinds and amounts of black particles added and kinds and amounts of inorganic fillers added, were changed variously, thereby obtaining semiconductor sealing materials.

Meanwhile, the intermediate particles 13 were produced by drying the core particles 2 at 150° C. for 24 hours using a dryer to reduce the water content thereof up to 1.91% by weight.

The essential production conditions and various properties of the obtained solid semiconductor sealing materials are shown in Table 14.

Examples 46 to 57 and Comparative Examples 18 to 21

The same procedure as defined in Example 5 was conducted except that kinds and amounts of black particles added and kinds and amounts of inorganic fillers added, were changed variously, thereby obtaining liquid semiconductor sealing materials.

Meanwhile, the intermediate particles 14 were produced by drying the core particles 4 at 120° C. for 24 hours using a dryer to reduce the water content thereof up to 1.95% by weight.

The essential production conditions and various properties of the obtained liquid semiconductor sealing materials are shown in Table 15.

TABLE 1

Properties of extender pigments

| Kind of core particles | Kind | Shape | Primary average particle diameter (μm) | Sphericity (−) |
|---|---|---|---|---|
| Core particles 1 | Silica | Spherical | 0.92 | 1.05 |
| Core particles 2 | Silica | Spherical | 0.60 | 1.01 |
| Core particles 3 | Silica | Spherical | 0.02 | 1.02 |
| Core particles 4 | Silica | Spherical | 3.92 | 1.01 |
| Core particles 5 | Silica | Spherical | 5.13 | 1.01 |

Properties of extender pigments

| Kind of core particles | BET specific surface area value (m²/g) | Water content (wt. %) | Fluidity index (−) |
|---|---|---|---|
| Core particles 1 | 3.3 | 3.10 | 49 |
| Core particles 2 | 3.8 | 3.02 | 51 |
| Core particles 3 | 196.2 | 8.12 | 58 |
| Core particles 4 | 0.7 | 2.92 | 48 |
| Core particles 5 | 0.4 | 2.73 | 50 |

Properties of extender pigments Hue

| Kind of core particles | L* value (−) | a* value (−) | b* value (−) | C* value (−) |
|---|---|---|---|---|
| Core particles 1 | 92.2 | 0.1 | 0.5 | 0.5 |
| Core particles 2 | 93.1 | 0.1 | 1.0 | 1.0 |
| Core particles 3 | 93.1 | 0.1 | 0.3 | 0.3 |
| Core particles 4 | 94.0 | 0.2 | 0.9 | 0.9 |
| Core particles 5 | 94.3 | 0.1 | 0.7 | 0.7 |

TABLE 2

Surface-treating step Additives

| Core particles | Kind of core particles | Kind | Calculated as | Amount (wt. %) |
|---|---|---|---|---|
| Core particles 6 | Core particles 1 | Sodium aluminate | Al | 0.5 |
| Core particles 7 | Core particles 2 | Aluminum sulfate | Al | 2.0 |
| Core particles 8 | Core particles 3 | Sodium aluminate | Al | 0.5 |
| Core particles 9 | Core particles 4 | Sodium aluminate | Al | 0.5 |
| Core particles 10 | Core particles 5 | Aluminum sulfate | Al | 1.0 |

Surface-treating step Coating material

| Core particles | Kind | Calculated as | Amount (wt. %) |
|---|---|---|---|
| Core particles 6 | A | Al | 0.49 |
| Core particles 7 | A | Al | 1.96 |
| Core particles 8 | A | Al | 0.49 |
| Core particles 9 | A | Al | 0.49 |
| Core particles 10 | A | Al | 0.99 |

TABLE 3

Properties of surface-treated extender pigments

| Kind of core particles | Primary average particle diameter (μm) | Sphericity (−) | BET specific surface area value (m²/g) |
|---|---|---|---|
| Core particles 6 | 0.92 | 1.05 | 3.7 |
| Core particles 7 | 0.61 | 1.01 | 4.6 |

TABLE 3-continued

| | | | |
|---|---|---|---|
| Core particles 8 | 0.02 | 1.02 | 186.3 |
| Core particles 9 | 3.92 | 1.01 | 1.2 |
| Core particles 10 | 5.13 | 1.01 | 0.6 |

| | Properties of surface-treated extender pigments | |
|---|---|---|
| Kind of core particles | Water content (wt. %) | Fluidity index (—) |
| Core particles 6 | 2.73 | 51 |
| Core particles 7 | 2.85 | 52 |
| Core particles 8 | 7.52 | 59 |
| Core particles 9 | 2.53 | 49 |
| Core particles 10 | 2.43 | 52 |

| | Properties of surface-treated extender pigments Hue | | | |
|---|---|---|---|---|
| Kind of core particles | L* value (—) | a* value (—) | b* value (—) | C* value (—) |
| Core particles 6 | 92.3 | 0.1 | 0.6 | 0.6 |
| Core particles 7 | 93.5 | 0.1 | 0.9 | 0.9 |
| Core particles 8 | 93.1 | 0.1 | 0.1 | 0.1 |
| Core particles 9 | 94.4 | 0.1 | 0.9 | 0.9 |
| Core particles 10 | 94.6 | 0.1 | 0.7 | 0.7 |

TABLE 4

| | Properties of black pigments | | |
|---|---|---|---|
| Black pigments | Kind | Shape | Average particle diameter (μm) |
| Black pigments A | Carbon black | Granular | 0.02 |
| Black pigments B | Carbon black | Granular | 0.04 |
| Black pigments C | Carbon black | Granular | 0.03 |

| | Properties of black pigments | | |
|---|---|---|---|
| Black pigments | BET specific surface area value (m²/g) | Water content (moisture resistance) (wt. part) | Blackness (L* value) (—) |
| Black pigments A | 134.0 | 0.82 | 16.6 |
| Black pigments B | 70.3 | 0.04 | 16.8 |
| Black pigments C | 84.6 | — | 17.0 |

TABLE 5

| | Production of black composite particles Coating step with gluing agent | | |
|---|---|---|---|
| | | Additives | |
| Examples and Comparative Examples | Kind of core particles | Kind | Amount added (wt. part) |
| Example 7 | Core particles 1 | Methyl hydrogen polysiloxane | 1.0 |
| Example 8 | Core particles 2 | Methyl triethoxysilane | 2.0 |
| Example 9 | Core particles 6 | γ-aminopropyl triethoxysilane | 1.0 |
| Example 10 | Core particles 7 | Polyvinyl alcohol | 5.0 |
| Comparative Example 1 | Core particles 2 | — | — |
| Comparative Example 2 | Core particles 2 | Methyl hydrogen polysiloxane | 0.005 |
| Comparative Example 3 | Core particles 2 | Methyl hydrogen polysiloxane | 1.0 |

| | Production of black composite particles Coating step with gluing agent | | | |
|---|---|---|---|---|
| | Edge runner treatment | | | Coating amount (calculated |
| Examples and Comparative Examples | Linear load (N/cm) | (Kg/cm) | Time (min) | as C) (wt. %) |
| Example 7 | 588 | 60 | 20 | 0.26 |
| Example 8 | 588 | 60 | 30 | 0.13 |
| Example 9 | 441 | 45 | 30 | 0.16 |
| Example 10 | 588 | 60 | 20 | 2.59 |
| Comparative Example 1 | — | — | — | — |
| Comparative Example 2 | 588 | 60 | 20 | $1 \times 10^{-3}$ |
| Comparative Example 3 | 588 | 60 | 30 | 0.26 |

| | Production of black composite particles Adhesion step with black pigments | |
|---|---|---|
| | Black pigments | |
| Examples and Comparative Examples | Kind | Amount added (wt. part) |
| Example 7 | A | 10.0 |
| Example 8 | C | 20.0 |
| Example 9 | A | 50.0 |
| Example 10 | C | 5.0 |
| Comparative Example 1 | A | 10.0 |
| Comparative Example 2 | A | 10.0 |
| Comparative Example 3 | A | 200.0 |

| | Production of black composite particles Adhesion step with black pigments | | | |
|---|---|---|---|---|
| | Edge runner treatment | | | Amount adhered (calculated |
| Examples and Comparative Examples | Linear load (N/cm) | (Kg/cm) | Time (min) | as C) (wt. %) |
| Example 7 | 588 | 60 | 60 | 9.01 |
| Example 8 | 588 | 60 | 120 | 16.54 |

TABLE 5-continued

| | | | | |
|---|---|---|---|---|
| Example 9 | 735 | 75 | 60 | 33.21 |
| Example 10 | 441 | 45 | 120 | 4.65 |
| Comparative Example 1 | 588 | 60 | 60 | 8.99 |
| Comparative Example 2 | 588 | 60 | 60 | 9.02 |
| Comparative Example 3 | 588 | 60 | 60 | 66.48 |

TABLE 6

Properties of black composite particles

| Examples and Comparative Examples | Primary average particle diameter (μm) | BET specific surface area value (m²/g) | Blackness (L* value) (−) | Tinting strength (%) |
|---|---|---|---|---|
| Example 6 | 0.604 | 16.5 | 18.4 | 120 |
| Example 7 | 0.922 | 9.2 | 18.5 | 127 |
| Example 8 | 0.604 | 15.0 | 18.3 | 130 |
| Example 9 | 0.925 | 22.1 | 17.8 | 134 |
| Example 10 | 0.603 | 6.8 | 19.4 | 125 |
| Comparative Example 1 | 0.603 | 12.9 | 22.1 | 100 |
| Comparative Example 2 | 0.603 | 12.1 | 21.2 | 103 |
| Comparative Example 3 | 0.611 | 63.2 | 16.9 | 131 |

Properties of black composite particles

| Examples and Comparative Examples | Fluidity index (−) | Moisture resistance (%) | Desorption degree of black pigments (−) |
|---|---|---|---|
| Example 6 | 59 | 0.25 | 3 |
| Example 7 | 65 | 0.20 | 4 |
| Example 8 | 68 | 0.19 | 5 |
| Example 9 | 69 | 0.17 | 5 |
| Example 10 | 64 | 0.22 | 5 |
| Comparative Example 1 | 47 | 0.68 | 1 |
| Comparative Example 2 | 50 | 0.64 | 2 |
| Comparative Example 3 | 51 | 0.33 | 2 |

TABLE 7

Production of semiconductor sealing material

| Examples and Comparative Examples | Black composite particles Kind | Amount added (wt. part) | Black pigments Kind | Amount added (wt. part) |
|---|---|---|---|---|
| Example 11 | Example 6 | 2.0 | — | — |
| Example 12 | Example 7 | 2.0 | — | — |
| Example 13 | Example 8 | 1.0 | — | — |
| Example 14 | Example 9 | 0.4 | — | — |
| Example 15 | Example 10 | 4.0 | — | — |
| Comparative Example 4 | — | — | A | 0.2 |
| Comparative Example 5 | — | — | C | 0.2 |
| Comparative Example 6 | Comparative Example 1 | 2.0 | — | — |
| Comparative Example 7 | Comparative Example 2 | 2.0 | — | — |
| Comparative Example 8 | Comparative Example 3 | 0.1 | — | — |

Production of semiconductor sealing material

| Examples and Comparative Examples | Inorganic filler Kind | Amount added (wt. part) |
|---|---|---|
| Example 11 | Core particles 2 | 78.0 |
| Example 12 | Core particles 1 | 78.0 |
| Example 13 | Core particles 2 | 79.0 |
| Example 14 | Core particles 1 | 79.6 |
| Example 15 | Core particles 2 | 76.0 |
| Comparative Example 4 | Core particles 2 | 79.8 |
| Comparative Example 5 | Core particles 2 | 79.8 |
| Comparative Example 6 | Core particles 2 | 78.0 |
| Comparative Example 7 | Core particles 2 | 78.0 |
| Comparative Example 8 | Core particles 2 | 79.9 |

Properties of semiconductor sealing material

| Examples and Comparative Examples | Dispersibility (−) | Blackness (L* value) (−) | Moisture resistance (%) |
|---|---|---|---|
| Example 11 | 4 | 20.6 | 0.15 |
| Example 12 | 4 | 20.7 | 0.09 |
| Example 13 | 5 | 20.0 | 0.08 |
| Example 14 | 5 | 19.5 | 0.06 |
| Example 15 | 5 | 21.4 | 0.10 |
| Comparative Example 4 | 1 | 23.4 | 0.26 |
| Comparative Example 5 | 1 | 23.8 | 0.26 |
| Comparative Example 6 | 1 | 24.3 | 0.38 |
| Comparative Example 7 | 2 | 23.5 | 0.33 |
| Comparative Example 8 | 2 | 18.0 | 0.25 |

Properties of semiconductor sealing material

| Examples and Comparative Examples | Volume resistivity value (Ω·cm) | Spiral flow value (cm) | Flexural strength (MPa) |
|---|---|---|---|
| Example 11 | $1.5 \times 10^9$ | 96 | 159 |
| Example 12 | $3.3 \times 10^{10}$ | 100 | 162 |
| Example 13 | $1.6 \times 10^{10}$ | 106 | 163 |
| Example 14 | $5.6 \times 10^9$ | 105 | 165 |
| Example 15 | $4.7 \times 10^{10}$ | 103 | 163 |
| Comparative Example 4 | $3.1 \times 10^7$ | 72 | 122 |
| Comparative Example 5 | $3.2 \times 10^7$ | 74 | 121 |
| Comparative Example 6 | $4.4 \times 10^7$ | 77 | 135 |
| Comparative Example 7 | $6.8 \times 10^7$ | 81 | 140 |
| Comparative Example 8 | $9.6 \times 10^7$ | 83 | 148 |

TABLE 8

Production of black composite particles
Coating step with gluing agent
Additives

| Examples and Comparative Examples | Kind of core particles | Kind | Amount added (wt. part) |
|---|---|---|---|
| Example 16 | Core particles 4 | Methyl hydrogen polysiloxane | 2.0 |
| Example 17 | Core particles 5 | Polyvinyl alcohol | 1.0 |
| Example 18 | Core particles 9 | Methyl triethoxysilane | 1.0 |
| Example 19 | Core particles 10 | γ-aminopropyl triethoxysilane | 2.0 |
| Comparative Example 9 | Core particles 5 | Methyl hydrogen polysiloxane | 2.0 |

Production of black composite particles
Coating step with gluing agent

| Examples and Comparative Examples | Edge runner treatment | | | Coating amount (calculated as C) (wt. %) |
|---|---|---|---|---|
| | Linear load (N/cm) | (Kg/cm) | Time (min) | |
| Example 16 | 588 | 60 | 30 | 0.54 |
| Example 17 | 588 | 60 | 30 | 0.54 |
| Example 18 | 588 | 60 | 20 | 0.07 |
| Example 19 | 441 | 45 | 45 | 0.31 |
| Comparative Example 9 | 588 | 60 | 30 | 0.53 |

Production of black composite particles
Adhesion step with carbon black
Carbon black

| Examples and Comparative Examples | Kind | Amount added (wt. part) |
|---|---|---|
| Example 16 | A | 10.0 |
| Example 17 | C | 20.0 |
| Example 18 | A | 50.0 |
| Example 19 | C | 5.0 |
| Comparative Example 9 | A | 200.0 |

Production of black composite particles
Adhesion step with carbon black

| Examples and Comparative Examples | Edge runner treatment | | | Amount adhered (calculated as C) (wt. %) |
|---|---|---|---|---|
| | Linear load (N/cm) | (Kg/cm) | Time (min) | |
| Example 16 | 735 | 75 | 30 | 9.13 |
| Example 17 | 735 | 75 | 60 | 16.51 |
| Example 18 | 588 | 60 | 60 | 32.96 |
| Example 19 | 588 | 60 | 120 | 4.76 |
| Comparative Example 9 | 588 | 60 | 30 | 66.39 |

TABLE 9

Properties of black composite particles

| Examples and Comparative Examples | Primary average particle diameter (μm) | BET specific surface area value (m$^2$/g) | Blackness (L* value) (-) | Tinting strength (%) |
|---|---|---|---|---|
| Example 16 | 3.92 | 3.8 | 18.6 | 126 |
| Example 17 | 5.14 | 3.2 | 18.5 | 129 |
| Example 18 | 3.92 | 6.3 | 18.0 | 135 |
| Example 19 | 5.13 | 7.4 | 19.5 | 126 |
| Comparative Example 9 | 5.14 | 61.6 | 17.1 | 132 |

Properties of black composite particles

| Examples and Comparative Examples | Fluidity index (-) | Moisture resistance (%) | Desorption degree of carbon black (-) |
|---|---|---|---|
| Example 16 | 66 | 0.19 | 4 |
| Example 17 | 68 | 0.18 | 4 |
| Example 18 | 70 | 0.17 | 5 |
| Example 19 | 64 | 0.21 | 5 |
| Comparative Example 9 | 51 | 0.31 | 2 |

TABLE 10

Production of liquid semiconductor sealing material

| Examples and Comparative Examples | Black composite particles | | Carbon black | |
|---|---|---|---|---|
| | Kind | Amount added (wt. part) | Kind | Amount added (wt. part) |
| Example 20 | Example 16 | 2.0 | — | — |
| Example 21 | Example 17 | 1.0 | — | — |
| Example 22 | Example 18 | 0.4 | — | — |
| Example 23 | Example 19 | 4.0 | — | — |
| Comparative Example 10 | — | — | A | 0.2 |
| Comparative Example 11 | — | — | B | 0.2 |
| Comparative Example 12 | Comparative Example 9 | 0.1 | — | — |

Production of liquid semiconductor sealing material
Filler

| Examples and Comparative Examples | Kind | Amount added (wt. part) |
|---|---|---|
| Example 20 | Core particles 4 | 68.2 |
| Example 21 | Core particles 5 | 69.2 |
| Example 22 | Core particles 4 | 69.6 |
| Example 23 | Core particles 5 | 66.0 |
| Comparative Example 10 | Core particles 5 | 69.8 |
| Comparative Example 11 | Core particles 5 | 69.8 |
| Comparative Example 12 | Core particles 5 | 69.9 |

TABLE 10-continued

| Examples and Comparative Examples | Properties of liquid semiconductor sealing material | | |
|---|---|---|---|
| | Viscosity (Pa·s) | Dispersibility (–) | Blackness (L* value) (–) |
| Example 20 | 462 | 4 | 20.8 |
| Example 21 | 488 | 4 | 20.5 |
| Example 22 | 440 | 5 | 20.1 |
| Example 23 | 474 | 5 | 21.4 |
| Comparative Example 10 | 1,210 | 1 | 23.6 |
| Comparative Example 11 | 1,088 | 1 | 24.0 |
| Comparative Example 12 | 1,452 | 1 | 18.4 |

| Examples and Comparative Examples | Properties of liquid semiconductor sealing material | | |
|---|---|---|---|
| | Moisture resistance (%) | Volume resistivity value ($\Omega \cdot cm$) | Flexural strength (MPa) |
| Example 20 | 0.08 | $3.5 \times 10^{10}$ | 103 |
| Example 21 | 0.07 | $2.1 \times 10^{10}$ | 105 |
| Example 22 | 0.05 | $6.0 \times 10^{9}$ | 106 |
| Example 23 | 0.09 | $4.4 \times 10^{10}$ | 100 |
| Comparative Example 10 | 0.25 | $2.8 \times 10^{7}$ | 71 |
| Comparative Example 11 | 0.25 | $3.0 \times 10^{7}$ | 72 |
| Comparative Example 12 | 0.24 | $9.5 \times 10^{7}$ | 78 |

TABLE 11

| Intermediate particles | Production of black composite particles Coating step with gluing agent Additives | | |
|---|---|---|---|
| | Kind of core particles | Kind | Amount added (wt. part) |
| Intermediate particles 1 | Core particles 1 | Methyl triethoxysilane | 4.0 |
| Intermediate particles 2 | Core particles 2 | Methyl hydrogen polysiloxane | 6.0 |
| Intermediate particles 3 | Core particles 3 | Methyl triethoxysilane | 25.0 |
| Intermediate particles 4 | Core particles 4 | Methyl hydrogen polysiloxane | 4.0 |
| Intermediate particles 5 | Core particles 5 | Methyl trimethoxysilane | 3.0 |
| Intermediate particles 6 | Core particles 6 | γ-aminopropyl triethoxysilane | 4.0 |
| Intermediate particles 7 | Core particles 7 | Phenyl triethoxysilane | 5.0 |
| Intermediate particles 8 | Core particles 8 | Methyl hydrogen polysiloxane | 25.0 |
| Intermediate particles 9 | Core particles 9 | Methyl triethoxysilane | 3.0 |
| Intermediate particles 10 | Core particles 10 | γ-aminopropyl triethoxysilane | 2.0 |
| Intermediate particles 11 | Core particles 2 | Polyvinyl alcohol | 3.0 |
| Intermediate particles 12 | Core particles 4 | Dimethyl polysiloxane | 2.0 |

TABLE 11-continued

| Intermediate particles | Production of black composite particles | | | |
|---|---|---|---|---|
| | Coating step with gluing agent Edge runner treatment | | Particle characteristics | |
| | Linear load (N/cm) | Time (min) | Coating amount (calculated as C) (wt. %) | Water content (wt. %) |
| Intermediate particles 1 | 588 | 30 | 0.45 | 1.90 |
| Intermediate particles 2 | 588 | 30 | 1.40 | 1.50 |
| Intermediate particles 3 | 784 | 60 | 2.51 | 1.70 |
| Intermediate particles 4 | 588 | 30 | 0.98 | 1.80 |
| Intermediate particles 5 | 588 | 30 | 0.34 | 1.50 |
| Intermediate particles 6 | 588 | 30 | 0.51 | 1.70 |
| Intermediate particles 7 | 588 | 30 | 2.10 | 1.70 |
| Intermediate particles 8 | 784 | 60 | 5.32 | 1.50 |
| Intermediate particles 9 | 588 | 30 | 0.33 | 1.60 |
| Intermediate particles 10 | 588 | 30 | 0.28 | 1.80 |
| Intermediate particles 11 | 392 | 20 | 1.38 | 2.50 |
| Intermediate particles 12 | 588 | 30 | 0.51 | 2.40 |

TABLE 12

| Examples and Comparative Examples | Production of black composite particles Adhering step with black pigments Black pigments | | |
|---|---|---|---|
| | Kind of core particles | Kind | Amount added (wt. part) |
| Example 24 | Intermediate particles 1 | A | 7.5 |
| Example 25 | Intermediate particles 2 | A | 10.0 |
| Example 26 | Intermediate particles 3 | B | 50.0 |
| Example 27 | Intermediate particles 4 | A | 10.0 |
| Example 28 | Intermediate particles 5 | A | 2.0 |
| Example 29 | Intermediate particles 6 | A | 15.0 |
| Example 30 | Intermediate particles 7 | B | 30.0 |
| Example 31 | Intermediate particles 8 | A | 80.0 |
| Example 32 | Intermediate particles 9 | A | 10.0 |
| Example 33 | Intermediate particles 10 | A | 5.0 |
| Comparative Example 13 | Core particles 2 | A | 10.0 |
| Comparative Example 14 | Core particles 4 | A | 10.0 |

TABLE 12-continued

Production of black composite particles
Adhering step with black pigments

| Examples and Comparative Examples | Edge runner treatment Linear load (N/cm) | Time (min) | Amount adhered (calculated as C) (wt. %) |
|---|---|---|---|
| Example 24 | 588 | 60 | 6.83 |
| Example 25 | 588 | 60 | 9.05 |
| Example 26 | 784 | 120 | 33.01 |
| Example 27 | 588 | 60 | 9.03 |
| Example 28 | 588 | 60 | 1.95 |
| Example 29 | 588 | 60 | 12.81 |
| Example 30 | 784 | 60 | 22.90 |
| Example 31 | 784 | 120 | 43.81 |
| Example 32 | 588 | 60 | 9.01 |
| Example 33 | 588 | 60 | 4.74 |
| Comparative Example 13 | 588 | 60 | 8.99 |
| Comparative Example 14 | 588 | 60 | 8.95 |

| Examples and Comparative Examples | Production of black composite particles Pulverization and classification steps Pulverization | Classification |
|---|---|---|
| Example 24 | Used | Used |
| Example 25 | Used | Used |
| Example 26 | Used | Used |
| Example 27 | Used | Used |
| Example 28 | Used | Used |
| Example 29 | Used | Used |
| Example 30 | Used | Used |
| Example 31 | Used | Used |
| Example 32 | Used | Used |
| Example 33 | Used | Used |
| Comparative Example 13 | Used | Used |
| Comparative Example 14 | Used | Used |

TABLE 13

Properties of black composite particles

| Examples and Comparative Examples | Primary average particle diameter (μm) | Sphericity (–) | Volume-average particle diameter ($D_{50}$) (μm) |
|---|---|---|---|
| Example 24 | 0.922 | 1.05 | 1.76 |
| Example 25 | 0.604 | 1.02 | 1.18 |
| Example 26 | 0.026 | 1.04 | 0.99 |
| Example 27 | 3.916 | 1.02 | 4.46 |
| Example 28 | 5.132 | 1.02 | 6.21 |
| Example 29 | 0.924 | 1.06 | 1.63 |
| Example 30 | 0.612 | 1.03 | 1.15 |
| Example 31 | 0.029 | 1.07 | 0.97 |
| Example 32 | 3.917 | 1.02 | 4.39 |
| Example 33 | 5.133 | 1.02 | 6.14 |
| Comparative Example 13 | 0.603 | 1.01 | 2.50 |
| Comparative Example 14 | 3.915 | 1.01 | 4.51 |

TABLE 13-continued

Properties of black composite particles

| Examples and Comparative Examples | Volume maximum particle diameter ($D_{99}$) (μm) | Standard deviation value of volume particle diameter (–) | BET specific surface area value ($m^2/g$) |
|---|---|---|---|
| Example 24 | 5.12 | 1.14 | 8.9 |
| Example 25 | 4.53 | 1.15 | 10.9 |
| Example 26 | 2.99 | 1.13 | 140.5 |
| Example 27 | 7.50 | 1.17 | 7.4 |
| Example 28 | 9.75 | 1.20 | 5.8 |
| Example 29 | 5.00 | 1.15 | 10.7 |
| Example 30 | 4.48 | 1.15 | 15.3 |
| Example 31 | 3.01 | 1.10 | 128.3 |
| Example 32 | 7.45 | 1.16 | 7.1 |
| Example 33 | 9.50 | 1.17 | 5.2 |
| Comparative Example 13 | 9.20 | 2.30 | 13.1 |
| Comparative Example 14 | 9.75 | 1.80 | 8.9 |

Properties of black composite particles

| Examples and Comparative Examples | Water content (wt. %) | Blackness ($L^*$ value) (–) | Tinting strength (%) |
|---|---|---|---|
| Example 24 | 0.62 | 18.7 | 125 |
| Example 25 | 0.31 | 17.9 | 128 |
| Example 26 | 0.38 | 17.3 | 130 |
| Example 27 | 0.59 | 18.9 | 124 |
| Example 28 | 0.42 | 19.8 | 122 |
| Example 29 | 0.48 | 17.9 | 127 |
| Example 30 | 0.36 | 17.5 | 130 |
| Example 31 | 0.25 | 17.0 | 133 |
| Example 32 | 0.55 | 18.5 | 125 |
| Example 33 | 0.65 | 19.2 | 124 |
| Comparative Example 13 | 2.62 | 22.5 | 100 |
| Comparative Example 14 | 2.52 | 22.7 | 100 |

Properties of black composite particles

| Examples and Comparative Examples | Fluidity index (–) | Moisture resistance (%) | Desorption percentage of black pigments (%) |
|---|---|---|---|
| Example 24 | 72 | 0.05 | 5.4 |
| Example 25 | 74 | 0.07 | 5.3 |
| Example 26 | 73 | 0.02 | 6.1 |
| Example 27 | 70 | 0.07 | 5.9 |
| Example 28 | 73 | 0.02 | 5.4 |
| Example 29 | 76 | 0.10 | 2.8 |
| Example 30 | 77 | 0.01 | 2.5 |
| Example 31 | 76 | 0.02 | 3.8 |
| Example 32 | 75 | 0.07 | 3.0 |
| Example 33 | 75 | 0.04 | 3.4 |
| Comparative Example 13 | 56 | 0.68 | 64.3 |
| Comparative Example 14 | 55 | 0.63 | 65.8 |

TABLE 14

Production of solid semiconductor sealing material

| Examples and Comparative Examples | Black particles Kind | Amount added (wt. part) | Inorganic filler Kind | Amount added (wt. part) |
|---|---|---|---|---|
| Example 34 | Example 24 | 2.9 | Intermediate particles 1 | 77.1 |
| Example 35 | Example 25 | 2.2 | Intermediate particles 2 | 77.8 |
| Example 36 | Example 26 | 0.6 | Intermediate particles 3 | 79.4 |
| Example 37 | Example 27 | 2.2 | Intermediate particles 4 | 77.8 |
| Example 38 | Example 28 | 10.2 | Intermediate particles 5 | 69.8 |
| Example 39 | Example 29 | 1.5 | Intermediate particles 6 | 78.5 |
| Example 40 | Example 30 | 0.9 | Intermediate particles 7 | 79.1 |
| Example 41 | Example 31 | 0.5 | Intermediate particles 8 | 79.5 |
| Example 42 | Example 32 | 2.2 | Intermediate particles 9 | 77.8 |
| Example 43 | Example 33 | 4.2 | Intermediate particles 10 | 75.8 |
| Example 44 | Example 25 | 2.2 | Intermediate particles 13 | 77.8 |
| Example 45 | Example 25 | 2.2 | core particles 2 | 77.8 |
| Comparative Example 15 | Black pigments B | 0.2 | core particles 2 | 79.8 |
| Comparative Example 16 | Black pigments A | 0.2 | Intermediate particles 13 | 79.8 |
| Comparative Example 17 | Comparative Example 13 | 2.2 | core particles 2 | 77.8 |

Properties of solid semiconductor sealing material

| Examples and Comparative Examples | Dispersibility (−) | Blackness (L* value) (−) | Soldering heat resistance (−) |
|---|---|---|---|
| Example 34 | 5 | 20.1 | 4 |
| Example 35 | 5 | 20.0 | 4 |
| Example 36 | 4 | 19.5 | 5 |
| Example 37 | 5 | 20.3 | 4 |
| Example 38 | 4 | 20.5 | 5 |
| Example 39 | 5 | 20.0 | 4 |
| Example 40 | 5 | 19.7 | 5 |
| Example 41 | 5 | 19.3 | 5 |
| Example 42 | 5 | 20.2 | 4 |
| Example 43 | 4 | 20.3 | 5 |
| Example 44 | 4 | 21.0 | 4 |
| Example 45 | 4 | 21.3 | 3 |
| Comparative Example 15 | 1 | 23.5 | 3 |
| Comparative Example 16 | 2 | 23.3 | 3 |
| Comparative Example 17 | 1 | 24.3 | 2 |

Properties of solid semiconductor sealing material

| Examples and Comparative Examples | Volume resistivity value (Ω·cm) | Spiral flow value (cm) | Flexural strength (Mpa) |
|---|---|---|---|
| Example 34 | 6.1 × 10$^{10}$ | 106 | 167 |
| Example 35 | 5.8 × 10$^{10}$ | 108 | 168 |
| Example 36 | 5.0 × 10$^{10}$ | 105 | 166 |
| Example 37 | 8.1 × 10$^{10}$ | 107 | 166 |
| Example 38 | 6.9 × 10$^{10}$ | 103 | 165 |
| Example 39 | 5.1 × 10$^{10}$ | 106 | 166 |
| Example 40 | 4.8 × 10$^{10}$ | 108 | 169 |
| Example 41 | 4.7 × 10$^{10}$ | 109 | 168 |
| Example 42 | 6.3 × 10$^{10}$ | 106 | 165 |
| Example 43 | 6.1 × 10$^{10}$ | 104 | 166 |
| Example 44 | 4.9 × 10$^{10}$ | 106 | 166 |
| Example 45 | 4.7 × 10$^{10}$ | 105 | 165 |
| Comparative Example 15 | 1.2 × 10$^{7}$ | 74 | 121 |
| Comparative Example 16 | 3.1 × 10$^{7}$ | 75 | 124 |
| Comparative Example 17 | 4.4 × 10$^{7}$ | 77 | 135 |

TABLE 15

Production of solid semiconductor sealing material

| Examples and Comparative Examples | Black particles Kind | Amount added (wt. part) | Inorganic filler Kind | Amount added (wt. part) |
|---|---|---|---|---|
| Example 46 | Example 24 | 2.9 | Intermediate particles 1 | 67.1 |
| Example 47 | Example 25 | 2.2 | Intermediate particles 2 | 67.8 |
| Example 48 | Example 26 | 0.6 | Intermediate particles 3 | 69.4 |
| Example 49 | Example 27 | 2.2 | Intermediate particles 4 | 67.8 |
| Example 50 | Example 28 | 10.2 | Intermediate particles 5 | 59.8 |
| Example 51 | Example 29 | 1.5 | Intermediate particles 6 | 68.5 |
| Example 52 | Example 30 | 0.9 | Intermediate particles 7 | 69.1 |
| Example 53 | Example 31 | 0.5 | Intermediate particles 8 | 69.5 |
| Example 54 | Example 32 | 2.2 | Intermediate particles 9 | 67.8 |
| Example 55 | Example 33 | 4.2 | Intermediate particles 10 | 65.8 |
| Example 56 | Example 27 | 2.2 | Intermediate particles 14 | 67.8 |
| Example 57 | Example 27 | 2.2 | core particles 4 | 67.8 |
| Comparative Example 18 | Black pigments A | 0.2 | core particles 4 | 69.8 |
| Comparative Example 19 | Black pigments B | 0.2 | core particles 4 | 69.8 |
| Comparative Example 20 | Black pigments A | 0.2 | Intermediate particles 14 | 69.8 |
| Comparative Example 21 | Comparative Example 14 | 2.2 | core particles 4 | 67.8 |

Properties of liquid semiconductor sealing material

| Examples and Comparative Examples | Viscosity (Pa·s) | Dispersibility (−) | Blackness (L* value) (−) |
|---|---|---|---|
| Example 46 | 411 | 5 | 20.6 |
| Example 47 | 390 | 5 | 20.5 |
| Example 48 | 421 | 4 | 20.1 |
| Example 49 | 386 | 5 | 20.7 |
| Example 50 | 395 | 4 | 20.8 |
| Example 51 | 403 | 5 | 20.4 |
| Example 52 | 383 | 5 | 20.1 |
| Example 53 | 417 | 4 | 19.6 |
| Example 54 | 370 | 5 | 20.6 |
| Example 55 | 381 | 4 | 20.8 |
| Example 56 | 403 | 4 | 20.8 |
| Example 57 | 447 | 4 | 20.6 |
| Comparative Example 18 | 1,318 | 1 | 23.7 |

TABLE 15-continued

| | | | |
|---|---|---|---|
| Comparative Example 19 | 1,043 | 1 | 24.1 |
| Comparative Example 20 | 1,156 | 2 | 23.6 |
| Comparative Example 21 | 1,238 | 1 | 24.7 |

| Examples and Comparative Examples | Properties of liquid semiconductor sealing material | |
|---|---|---|
| | Volume resistivity value ($\Omega \cdot$ cm) | Flexural strength (MPa) |
| Example 46 | $5.0 \times 10^{10}$ | 105 |
| Example 47 | $4.3 \times 10^{10}$ | 107 |
| Example 48 | $8.7 \times 10^{9}$ | 106 |
| Example 49 | $3.7 \times 10^{10}$ | 106 |
| Example 50 | $7.2 \times 10^{10}$ | 105 |
| Example 51 | $6.3 \times 10^{10}$ | 106 |
| Example 52 | $1.2 \times 10^{10}$ | 108 |
| Example 53 | $4.0 \times 10^{10}$ | 108 |
| Example 54 | $6.1 \times 10^{10}$ | 107 |
| Example 55 | $5.9 \times 10^{10}$ | 106 |
| Example 56 | $4.0 \times 10^{10}$ | 105 |
| Example 57 | $3.4 \times 10^{10}$ | 105 |
| Comparative Example 18 | $2.9 \times 10^{7}$ | 71 |
| Comparative Example 19 | $3.2 \times 10^{7}$ | 73 |
| Comparative Example 20 | $3.5 \times 10^{7}$ | 74 |
| Comparative Example 21 | $4.8 \times 10^{7}$ | 72 |

What is claimed is:

1. Black composite particles for semiconductor sealing material, comprising:
   an extender pigment as a core particle; and
   a black pigment formed on surface of the extender pigment in an amount of from 1 to 100 parts by weight based on 100 parts by weight of the extender pigment.

2. Black composite particles according to claim 1, wherein the black pigment is carbon black.

3. Black composite particles according to claim 1, wherein the black pigment is formed on the surface of the extender pigment through a gluing agent coating layer.

4. Black composite particles according to claim 1, which have a primary average particle diameter of 0.005 to 30.0 µm, a BET specific surface area value of 0.1 to 500 m$^2$/g, and a blackness (L* value) of 14.5 to 22.0.

5. Black composite particles according to claim 1, wherein the extender pigment as a core particle has a coat comprising at least one selected from the group consisting of hydroxides of aluminum, oxides of aluminum, hydroxides of silicon and oxides of silicon.

6. A semiconductor sealing material comprising:
   black composite particles comprising an extender pigment as a core particle and a black pigment formed on surface of the extender pigment in an amount of 1 to 100 parts by weight based on 100 parts by weight of the extender pigment; and
   a binder resin.

7. A semiconductor sealing material according to claim 6, wherein the black pigment is carbon black.

8. A semiconductor sealing material according to claim 6, wherein the black pigment is formed on the surface of the extender pigment through a gluing agent coating layer.

9. A semiconductor sealing material according to claim 6, wherein the amount of the black composite particles is 0.4 to 95% by weight.

10. A semiconductor sealing material according to claim 6, which has a blackness (L* value) of 14.5 to 24.0, a volume resistivity value of not less than $5.0 \times 10^{7}$ $\Omega \cdot$cm and a flexural strength at room temperature of not less than 150 MPa.

11. A semiconductor sealing material according to claim 6, wherein the semiconductor sealing material is a liquid semiconductor sealing material containing the black composite particles in an amount of 0.4 to 80% by weight.

12. A semiconductor sealing material according to claim 11, wherein the liquid semiconductor sealing material has a viscosity of 250 to 750 Pa·s and a volume resistivity value of not less than $5.0 \times 10^{7}$ $\Omega \cdot$cm.

13. Black composite particles for semiconductor sealing material, comprising:
   an extender pigment as a core particle; and
   a carbon black coat formed on surface of the extender pigment in an amount of 1 to 100 parts by weight based on 100 parts by weight of the extender pigment.

14. Black composite particles for semiconductor sealing material, having an primary average particle diameter of 0.005 to 30.0 µm, and comprising:
   an extender pigment as a core particle;
   a gluing agent coating layer formed on surface of the extender pigment; and
   a black pigment coat formed on the gluing agent coating layer in an amount of 1 to 100 parts by weight based on 100 parts by weight of the extender pigment.

15. A semiconductor sealing material, comprising:
   black composite particles comprising an extender pigment as a core particle and a carbon black coat formed on surface of the extender pigment in an amount of 1 to 100 parts by weight based on 100 parts by weight of the extender pigment; and
   a binder resin.

16. A semiconductor sealing material, comprising:
   black composite particles having an primary average particle diameter of 0.005 to 30.0 µm and comprising an extender pigment as a core particle, a gluing agent coating layer formed on surface of the extender pigment, and a black pigment coat formed on the gluing agent coating layer in an amount of 1 to 100 parts by weight based on 100 parts by weight of the extender pigment; and
   a binder resin.

17. A liquid semiconductor sealing material, comprising:
   black composite particles having an primary average particle diameter of 1.0 to 30.0 µm, and comprising an extender pigment as a core particle, a gluing agent coating layer formed on surface of the extender pigment, and a carbon black coat formed on the gluing agent coating layer in an amount of 1 to 100 parts by weight based on 100 parts by weight of the extender pigment; and
   a binder resin.

18. Black composite particles for semiconductor sealing material, having have a primary average particle diameter of 0.005 to 30.0 µm, a BET specific surface area value of 0.1 to 500 m$^2$/g, and a blackness (L* value) of 14.5 to 22.0, comprising:
   an extender pigment as a core particle; and
   a black pigment formed on surface of the extender pigment in an amount of from 1 to 100 parts by weight based on 100 parts by weight of the extender pigment.

19. Black composite particles for semiconductor sealing material, having have a primary average particle diameter of 0.005 to 30.0 μm, a BET specific surface area value of 0.1 to 500 m²/g, and a blackness (L* value) of 14.5 to 22.0, comprising:
    an extender pigment as a core particle;
    a gluing agent coating layer formed on surface of the extender pigment; and
    a black pigment coat formed on the gluing agent coating layer in an amount of 1 to 100 parts by weight based on 100 parts by weight of the extender pigment.

20. A semiconductor sealing material having has a blackness (L* value) of 14.5 to 24.0, a volume resistivity value of not less than $5.0 \times 10^7$ Ω·cm and a flexural strength at room temperature of not less than 150 MPa,
    comprising:
    black composite particles comprising an extender pigment as a core particle and a black pigment formed on surface of the extender pigment in an amount of 1 to 100 parts by weight based on 100 parts by weight of the extender pigment; and
    a binder resin.

\* \* \* \* \*